United States Patent
Shimamoto et al.

(10) Patent No.: US 6,743,739 B2
(45) Date of Patent: Jun. 1, 2004

(54) FABRICATION METHOD FOR SEMICONDUCTOR INTEGRATED DEVICES

(75) Inventors: Yasuhiro Shimamoto, Hachioji (JP); Masahiko Hiratani, Akishima (JP); Yuichi Matsui, Kokubunji (JP); Toshihide Nabatame, Tsukuba (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 10/101,600

(22) Filed: Mar. 21, 2002

(65) Prior Publication Data

US 2002/0192899 A1 Dec. 19, 2002

(30) Foreign Application Priority Data

Mar. 26, 2001 (JP) .......................... 2001-086930

(51) Int. Cl.[7] .......................... H01L 21/31; H01L 21/44
(52) U.S. Cl. .................... 438/780; 438/778; 438/680; 438/686; 438/681
(58) Field of Search ................. 438/780, 680, 438/686, 240, 778, 650, 681, 758, 430, 627, 239, 253, 396, 575, 580

(56) References Cited

U.S. PATENT DOCUMENTS 6,284,655 B1 * 9/2001 Marsh .......................... 438/681
6,440,495 B1 * 8/2002 Wade et al. .................. 427/250

OTHER PUBLICATIONS

Tomonori Aoyama, Masahiro Kiyotoshi, Soichi Yamazaki and Kazuhiro Eguchi, "Chemical Vapor Deposition of Ru and Its Application in (Ba,Sr) $TiO_3$ Capacitors for Future Dynamic Random Access Memories", Jpn. J. Appl. Phys. vol. 38 (1999), pp. 2194–2199.

* cited by examiner

Primary Examiner—Matthew Smith
Assistant Examiner—Igwe U. Anya
(74) Attorney, Agent, or Firm—Reed Smith LLP; Stanley P. Fisher, Esq.; Juan Carlos A. Marquez, Esq.

(57) ABSTRACT

A process for forming the lower and upper electrodes of a high dielectric constant capacitor in a semiconductor device from an organoruthenium compound by chemical vapor deposition. This chemical vapor deposition technique employs an organoruthenium compound, an oxidizing gas, and a gas (such as argon) which is hardly adsorbed to the ruthenium surface or a gas (such as ethylene) which is readily adsorbed to the ruthenium surface. This process efficiently forms a ruthenium film with good conformality in a semiconductor device.

11 Claims, 13 Drawing Sheets

FABRICATION METHOD FOR SEMICONDUCTOR INTEGRATED DEVICES

CLAIM OF PRIORITY

The present invention claims priority to Japanese Patent Application No. 2001-086930 filed on Mar. 26, 2001.

BACKGROUND OF THE INVENTION

1. Field of the Invention

The present invention relates to processes for fabricating semiconductor devices with a high dielectric constant capacitor.

2. Description of the Background

Semiconductor devices such as dynamic random access memories (DRAM) have achieved high capacity through reduction in the cell area. An inevitable consequence of this reduction is a decrease in the area available for capacitors. Nevertheless, it is still essential for a semiconductor device to store a certain amount of stored charge necessary for memory reading without soft errors. In other words, for high capacity semiconductor devices, it is necessary to provide some means by which to increase the amount of stored charge per unit area. One way to address this need is to form the capacitor insulating film from an oxide dielectric material having a high dielectric constant.

A conventional capacitor insulating film used for memory LSI (Large Scale Integration) is $SiO_2$ film (with a dielectric constant of 3.8) or $Si_3N_4$ film (with a dielectric constant of 7 to 8). There materials are currently being replaced by $Ta_2O_5$ film (with a dielectric constant higher than 20). To store a much larger amount of charge, it has been proposed to form the capacitor insulating film from an oxide dielectric material having a dielectric constant greater than 100, as exemplified by strontium titanate ($SrTiO_3$, "STO" for short), barium strontium titanate (($Ba,Sr)TiO_3$, "BST" for short), lead titanate zirconate ($Pb(Zr,Ti)_3$, "PZT" for short), or bismuth-based laminar ferroelectrics. However, these oxide dielectric materials (including $Ta_2O_5$) have the disadvantage of requiring post heat treatment at high temperatures (e.g., 300–700° C.) in an oxidizing atmosphere to obtain these improved electrical properties. This heat treatment typically causes the lower electrode to be oxidized by oxygen in the oxidizing atmosphere, which may result in an insulating film having a lower dielectric constant than the capacitor insulating film. Consequently, there may be a substantial decrease in the capacity of capacitor.

A promising way to address this problem is to form the lower electrode from platinum (Pt), ruthenium (Ru), iridium (Ir), or the like. Pt is comparatively stable when subjected to a high temperature and oxidizing atmosphere. Ru and Ir retain electrical conductivity even after oxide formation. Of these materials, Ru is suitable for microfabrication and is the most desirable as the lower electrode for oxide dielectric material. In addition, a Ru electrode has a large work function and prevents leakage current due to the height of the Schottky barrier at the interface between the capacitor insulating film and the electrode. Therefore, Ru is also a promising material for the upper electrode.

Even though capacitors on a memory LSI of Giga-bit scale may be formed from the Ru electrode and the above-mentioned oxide dielectric material, it is not conventionally possible to secure the amount of stored charge necessary for reading because the area for capacitors is too small. Thus, there arises a need to make the capacitor three-dimensional in order to substantially increase the capacitor area. One way to address this need requires the several steps of: (1) forming a three-dimensional lower electrode from Ru; (2) forming an oxide dielectric material as a capacitor insulating film; and (3) forming an upper electrode from Ru on the oxide dielectric material. These steps essentially involve chemical vapor deposition to form the Ru electrodes.

An exemplary process for forming a Ru film by chemical vapor deposition from an organoruthenium compound as a precursor is described in *Japanese Journal of Applied Physics*, 38 (1999), p. 2194. This process uses bis (cyclopentadienyl) ruthenium ($Ru(C_5H_5)_2$) as a raw material to form the Ru film.

The three-dimensional lower and upper electrodes are preferably formed by making deep holes in the surface of silicon oxide film (which permits easy microfabrication) and subsequently depositing Ru by chemical vapor deposition. This procedure may involve the problems explained below with reference to FIG. 11 (a sectional view).

It is assumed that a plug 1 of titanium nitride and an insulating interlayer 2 of $SiO_2$ (in the plug area) have been formed. The procedure starts with depositing a 700-nm thick insulating interlayer 3 of $SiO_2$ (in the capacitor area). Subsequently, deep holes are formed in the insulating interlayer 3 by well-known photolithography and dry etching techniques such that the bottom of the holes reaches the surface of the insulating interlayer 2. These holes preferably have a round, elliptical, or rectangular opening. The diameter of the opening is smaller than 130 nm in a memory LSI of Giga-bit scale.

If each capacitor is to have a capacity larger than 30 fF per bit, the insulating interlayer 3 should have a thickness (equivalent to a hole depth) of at least 700 nm, even in the case where the insulating film of BST has a thickness of 0.4 nm in terms of $SiO_2$. Thus, the deep hole requires an aspect ratio no smaller than 5, wherein the "aspect ratio" is defined as the ratio of a hole depth to an opening diameter. If the capacitor insulating film is formed from $Ta_2O_5$ with a thickness of 0.8 nm in terms of $SiO_2$, then the insulating interlayer 3 needs to be thicker than 1500 nm or the hole needs to be deeper than 1500 nm (with an aspect ratio of 11 at least). In this deep hole is formed the lower ruthenium electrode 10 (20 nm thick) by chemical vapor deposition. See, FIG. 11(*a*).

Several potential problems as pointed out below are involved in the conventional chemical vapor deposition from an organoruthenium compound as a precursor. According to the above-mentioned paper, the procedure uses bis (cyclopentadienyl) ruthenium ($C_5H_5)_2$) as a precursor, and the ruthenium film is formed by reactions in two stages. The reaction in the first stage is limited by the surface reaction which has an activation energy of 2.48 eV at a film-forming temperature no higher than 250° C. and at an oxygen partial pressure of 0.07 Torr. As the temperature exceeds 250° C., the reaction in the second stage takes place which is limited by the mass transport. In this second stage, the film forming rate becomes constant at approximately 23 nm/min. This procedure results in such a high conformality so as to form a ruthenium film with a step coverage of nearly 100% in a deep hole (having a diameter of 130 nm and an aspect ratio of 4) at a film-forming temperature of 230° C. Unfortunately, the film-forming rate at 230° C. is only about 2.8 nm/min. Therefore, because it takes about 7 minutes to form a 20-nm thick film, the procedure mentioned above may not be suitable for mass production because of the low throughput. In addition, if the above procedure is to be applied to the capacitors of a Giga-bit DRAM, it should be able to form ruthenium film for the upper electrode in a deep hole having an aspect ratio no smaller than 12, even in a case where BST is used for the capacitor insulating film.

After the ruthenium film has been formed as shown in FIG. 11(a), subsequent steps are carried out in the following manner. The lower electrode which has been deposited on the insulating interlayer 3 is removed by sputter etching so as to electrically isolate adjacent capacitors from each other. Thus, a three-dimensional lower electrode structure is obtained, as shown in FIG. 11(b).

Subsequently, an oxide dielectric material 6 is the deposited by chemical vapor deposition. In the case of BST, the thickness of the deposit is 20 nm. In the case of $Ta_2O_5$, the thickness of deposit is 10 nm. Thereafter, the upper ruthenium electrode 7 is formed by chemical vapor deposition. In this way the capacitor is completed as shown in FIG. 11(c). It is necessary that the upper ruthenium electrode should completely cover the inside wall of the deep hole having a diameter no larger than 60 nm, a depth no smaller than 700 nm, and an aspect ratio no smaller than 12. It should be noted that the "step coverage" is defined as a ratio of b/a, where a is the thickness of the film deposited on the surface surrounding a hole and b is the thickness of the film deposited on the sidewall near the lower part of a hole (or b may represent the thickness of the film at the thinnest part).

The foregoing may be summarized as follows. The chemical vapor deposition of an organoruthenium compound should be carried out under surface reaction conditions that permits deposition on the sidewall of a deep hole having an aspect ratio of at least 12. In addition, it is also necessary that the film-forming rate should be high (or the reaction probability should be high) for high productivity, and the reaction should take place without an incubation period.

SUMMARY OF THE INVENTION

In at least one embodiment, the present invention preferably provides a process for fabricating semiconductor devices involving the efficient formation of ruthenium film with good conformality (i.e., an even thickness or a step coverage of approximately 1). An exemplary process according to the present invention to achieve the above comprises a step of forming a ruthenium film on a surface of a substrate having holes by chemical vapor deposition from an organoruthenium compound as a precursor. This step is preferably carried out in the presence of oxygen and a gas which prevents the substrate surface from adsorbing oxygen in such a way that the decomposition of the organoruthenium compound on the surface is adequately controlled.

In addition, the process of the present invention comprises a step of forming the lower and upper electrodes of a high dielectric constant capacitor for the semiconductor device by chemical vapor deposition from an organoruthenium compound as a precursor. This step is carried out in the presence of oxygen and a gas which prevents the substrate surface from adsorbing oxygen in such a way that the decomposition of the organoruthenium compound on the surface is adequately controlled.

In either case, the gas used to prevent oxygen adsorption should preferably be one which is liquid at room temperature, has a boiling point no higher than 150° C., and dissolves the organoruthenium compound in a concentration of at least 0.001 mol/L. The gas should preferably be at least one compound selected from the group consisting of methanol, ethanol, 1-propanol, 2-propanol, isobutyl alcohol, 1-butanol, 2-butanol, diethyl ether, diisopropyl ether, tetrahydrofuran, tetrahydropyran, 1,4-dioxane, acetone, methyl ethyl ketone, and toluene.

Additionally, the chemical vapor deposition should preferably be preceded by a step of forming a seed layer comprised of at least one metal selected from the group consisting of ruthenium, platinum, iridium, rhodium, osmium, palladium, cobalt, iron, and alloys thereof.

The above-mentioned method makes it possible to control the amount of oxygen adsorbed on the surface inside the hole. The process of the present invention is explained more fully below in which the organoruthenium compound is bis(ethylcyclopentadienyl)ruthenium ($Ru(C_2H_5C_5H_4)_2$ or $Ru(EtCp)_2$) and the oxygen absorption preventing gas is tetrahydrofuran (THF).

$Ru(EtCp)_2$ is used in the form of gas after heating and vaporization (liquid bubbling method). THF is introduced into the reaction chamber in the form of a gas after heating (at least 80° C.) for vaporization. The partial pressure of each gas in the mixture (which is comprised of the organoruthenium compound, oxidizing gas, inert gas, and oxygen adsorption preventing gas which are present in the film-forming chamber) is defined as the value obtained by multiplying the mole fraction of each gas supplied by the total pressure of the mixture gas.

The film-forming rate depends on the film-forming temperature as shown in FIG. 6. Film forming was carried out on $SiO_2$ or Ru in the absence or presence of THF (at a partial pressure of 2.8 Torr), at an oxygen partial pressure of 0.24 Torr. A Ru layer was previously formed in the hole by the long throw sputtering (LTS method). When a 50-nm thick film was formed on the flat surface at a film-forming temperature of 300° C., a Ru seed layer (about 1–2 nm thick) was formed on the inside wall of the hole. It should be noted that the hole has a diameter of 130 nm, a depth of 800 nm, and an aspect ratio of 6.1.

In the case where THF is not introduced, the film-forming rate is limited by the surface reaction with an activation energy of 0.37 eV regardless of the underlayer at a film-forming temperature below 300° C. This surface reaction is limited by the amount of oxygen adsorbed onto the surface, as explained below with reference to FIG. 7. At a film-forming temperature above 300° C., the reaction is limited by the amount of precursor supplied. The conformality is comparatively good in the reactions which are limited by the amount of oxygen adsorbed onto the surface; however, the step coverage is only about 40% at a film-forming temperature of 230° C. This reaction has a certain amount of incubation period before the formation of the Ru film commences. However, the incubation period for the film on Ru is shorter than that for the film on $SiO_2$. At a film-forming temperature of 230° C., there is an incubation period of 5 minutes for the film on $SiO_2$ but there is no incubation period for the film on Ru. This may occur because more oxygen is adsorbed on Ru in a shorter time.

By contrast, the film-forming reaction differs greatly depending on whether the film is formed on $SiO_2$ or Ru in the presence of THF at a partial pressure of 2.8 Torr. On $SiO_2$, the Ru film is formed by an oxidative decomposition reaction with an activation energy of 0.37 eV. However, the reaction region is shifted higher by about 130° C. compared to the case where no THf is introduced. This suggests that THF prevents oxygen adsorption in the low temperature region. An incubation period exists as in the case where no THF gas is introduced, and the step coverage is less than 20%. By contrast, the Ru film on Ru, unlike on $SiO_2$, is formed at nearly a constant rate at film-forming temperature of at least 200° C. No incubation period exists, and the step coverage in the hole is almost 100%.

In order to elucidate the above-mentioned reactions, experiments were carried out in which the partial pressure of THF was kept constant at 2.8 Torr and the partial pressure of oxygen was varied. The step coverage and the film-forming rate depend on the oxygen partial pressure as shown in FIG. 7(a) and FIG. 7(b), respectively. The film-forming temperature is 300° C. and the film-forming time is 2 minutes. It is noted from FIGS. 7(a) and 7(b) that reactions take place differently depending on whether the oxygen partial pressure is lower than or higher than about 0.4 Torr. It is also noted that the rate of film forming on Ru increases linearly in the region of low oxygen partial pressure (at 0.07 Torr and above) and reaches a plateau in the region of high oxygen partial pressure. By contrast, the step coverage uniformly (but not necessarily linearly) decreases in the region of low oxygen partial pressure and converges to a constant value of 50% in the region of high oxygen partial pressure. FIG. 7(b) also shows the rate of film forming on $SiO_2$. It is noted that the film-forming rate increases steeply in the region of high oxygen partial pressure at around 0.4 Torr and above. The film-forming rate in the region of low oxygen partial pressure below about 0.4 Torr is zero because of an incubation period longer than 2 minutes.

The mechanism of film forming on Ru differs depending on the oxygen partial pressure. In the region of low oxygen partial pressure below approximately 0.4 Torr, the reaction is limited by the oxygen supply because the sticking probability increases in proportion to oxygen partial pressure. Conformality in this region is good because the surface reaction depends on the amount of oxygen adsorbed, and the organoruthenium compound and oxygen diffuse into the inside of the hole so that the density of oxygen adsorption is equal to that on the substrate surface. On the other hand, the rate of film forming in the region of high oxygen partial pressure does not vary regardless of the oxygen partial pressure, and the reaction is limited by the supply of precursor in the temperature region for the saturated film-forming rate as shown in FIG. 7(a). It is considered that conformality is poor because the precursor gas is captured by the flat surface of the substrate, and the supply of precursor gas into the inside of the hole is limited.

The effect of the partial pressure of THF gas on the step coverage is evaluated in FIG. 8. FIG. 8 shows how the step coverage and film-forming rate depend on the partial pressure of THF gas, with the partial pressure of oxygen kept constant at 0.11 Torr. Experiments were performed on three kinds of substrates varying in the aspect ratio of holes. On the inside of the hole, a Ru seed layer (1–2 nm thick) was formed by long throw sputtering. The hole with the largest aspect ratio (15.4) has a diameter of 130 nm and a depth of 2000 nm. When the partial pressure of THF is lower than 1.0 Torr, the step coverage and film-forming rate do not depend on the partial pressure of THF gas. There is no difference from those in the conventional case where THF (as the gas to prevent oxygen adsorption) is not present. However, at a partial pressure of THF gas in excess of 1.0 Torr, the step coverage increases. Further, when the partial pressure of THF gas reaches 2.9 Torr, the step coverage is nearly 100% (at an aspect ratio of 15.4). In the case of a hole with a small aspect ratio, the partial pressure of THF gas that permits 100% step coverage is as low as 1.5 Torr. On the other hand, the film-forming rate decreases as the partial pressure of THF gas increases.

The foregoing suggests that the partial pressure of THF gas controls the oxygen adsorption density and the distribution of oxygen density in the hole. It is considered that when the partial pressure of THF gas is small, the oxygen supplied is mostly adsorbed by the patterned flat part or the upper inside of the hole and hence does not reach deep inside the hole. Thus, it is further considered that the oxidation decomposition reaction of the organoruthenium compound, which is limited by the amount of oxygen adsorbed, proceeds, thereby aggravating conformality at the bottom of the hole. On the other hand, it is considered that when the partial pressure of THF is high, THF gas sufficiently adsorbs to the surface of the Ru seed layer, thereby preventing the adsorption of oxygen but permitting the diffusion of oxygen to the bottom of the hole, and a constant low density of oxygen adsorption is realized. This causes good conformality at the bottom of the hole. In addition, it is considered that the density of oxygen adsorption decreases with an increasing partial pressure of THF gas, and, hence, the film-forming rate also decreases as shown in FIG. 8(b).

FIGS. 6 through 8 show that the introduction of THF gas controls the state of oxygen adsorption on the substrate surface and permits the Ru film to be formed with good conformality at a high rate without an incubation period. Since the Ru film is formed by the decomposition reaction of a precursor which is limited by the density of oxygen adsorbed, it is possible to optimize the supply of precursor. The present invention addresses the limitations of the conventional technology by preferably providing a process in which the film-forming time is shorter and the precursor is used more efficiently, which leads to increased productivity and decreased production cost. Thus the present invention may be useful for forming capacitor electrodes in Giga-scale DRAMs.

The above-mentioned effect may also be obtained even though THF (as the oxygen adsorption preventing gas) is replaced by at least one compound selected from the group consisting of methanol, ethanol, 1-propanol, 2-propanol, isobutyl alcohol, 1-butanol, 2-butanol, diethyl ether, diisopropyl ether, tetrahydropyran, 1,4-dioxane, acetone, methyl ethyl ketone, and toluene.

It is possible to simultaneously supply both the organoruthenium compound and the oxygen adsorption preventing gas if the former is dissolved in the latter in liquid form (e.g., THF and the like mentioned above) and the resulting diluted solution is vaporized by heating. It is also possible to adequately control the partial pressure of oxygen and the partial pressure of gas (evolving from the diluted solution) in the film-forming chamber if the supply of the diluted solution is controlled and the oxygen adsorption preventing gas is introduced through another route. In practice, for example, $Ru(EtCp)_2$ as an organoruthenium compound may be dissolved in THF, and the resulting solution is fed after vaporization in a constant temperature bath at 150° C. If the partial pressure of oxygen and THF gas is adjusted to 0.1 Torr and 3.0 Torr in the film-forming chamber, respectively, it is possible to realize the reaction condition which permits high step coverage as mentioned above.

The organoruthenium compounds that may be used, in addition to the bis(ethylcyclopentadienyl)ruthenium ($Ru(C_2H_5C_5H_4)_2$) mentioned above include: bis(cyclopentadienyl)ruthenium ($Ru(C_2H_5)_2$); bis(methylcyclopentadienyl)ruthenium ($Ru(CH_3C_5H_4)_2$); and tris(dipivaloylmethanate) ruthenium ($Ru(C_{11}H_{19}O_2)_3$): These compounds undergo chemical vapor deposition by the same mechanism as that of bis(ethylcyclopentadienyl) ruthenium ($Ru(C_2H_5C_5H_4)_2$). These organoruthenium compounds permit the substrate temperature and oxygen partial pressure to be optimally controlled if the oxygen adsorption preventing gas is introduced.

Table 1 shows the substrate temperature, the partial pressure of oxygen, and the partial pressure of oxygen adsorption preventing gas which are optimal for the individual organoruthenium compounds. Any organoruthenium compound other than those listed in Table 1 may be used for the above-mentioned film-forming process so long as it is an organic compound of noble metal which is decomposed by surface-adsorbed oxygen.

TABLE 1

| Compound | Bis(cyclopenta-dienyl)-ruthenium | Bis(methylcyclo-pentadienyl)-ruthenium | Bis(ethylcyclo-pentadienyl)-ruthenium | Tris(dipivaloyl-methanate)-ruthenium |
|---|---|---|---|---|
| Partial pressure of oxygen (Torr) | 0.01–1.0 | 0.01–1.0 | 0.01–1.0 | 0.001–1.0 |
| Partial pressure of oxygen adsorption preventing gas (Torr) | >1.0 | >1.0 | >1.0 | >1.0 |
| Film-forming temperature (° C.) | 200–450 | 200–450 | 200–450 | 150–450 |

A ruthenium film with good conformality is formed by supplying a gas which is hardly adsorbed to Ru surface in the following manner. In order to deposit a ruthenium film with good conformality as mentioned above, it is necessary to keep the adsorption density of oxidizing gas on the growth surface (Ru surface) constant and low. An example of a practical procedure is given below in the case where the organoruthenium compound is $Ru(C_5H_4C_2H_5)_2$ or $Ru(EtCp)_2$ and the oxidizing gas is oxygen. The precursor is supplied by the liquid bubbling method.

The procedure starts with the formation of a Ru seed layer (20 nm thick) by sputtering, and then the desired film is formed. The seed layer reduces the incubation period required for growth nucleation. The supply of oxygen and the supply of argon (not as a carrier gas) are controlled so that oxygen and argon each have a desired partial pressure.

FIG. 13 shows how the activation energy for decomposition reaction of $Ru(EtCp)_2$ varies with the partial pressure of $O_2$ and the partial pressure of Ar. It is noted from FIG. 13 that a shift takes place from the decomposition mechanism with an activation energy of about 1.4 eV to the decomposition mechanism with an activation energy of about 0.4 eV at a certain partial pressure of oxygen, which rarely depends on the partial pressure of argon. It is also noted that the lower the partial pressure of oxygen, the better the conformality, with very little dependence of the partial pressure of argon. Hatching in FIG. 13 denotes the region for high step coverage (with an aspect ratio of 15). It is noted that good coverage of Ru film is formed on the sidewall of a deep hole with an aspect ratio of 15 when the partial pressure of oxygen is lower than 0.007 Torr, regardless of the partial pressure of argon. This suggests that the density of oxygen adsorbed on the surface is determined mainly by the partial pressure of oxygen.

The same results as above were obtained with a rare gas (such as Ne, He, and Xe) in place of argon. In the case of nitrogen ($N_2$) and carbon dioxide ($CO_2$), the partial pressure of oxygen (which changes the activation energy) shifts to the higher side as their partial pressure increases, as shown in FIG. 13. In this case, the high-coverage region (hatched with horizontal lines in FIG. 13) shifts to the higher partial pressure of oxygen by no more than about 0.01 Torr. However, this change is smaller as compared with that shown in FIG. 14 (explained below). It is therefore considered that the density of oxygen adsorbed to the surface is determined almost entirely by the partial pressure of oxygen in this case too.

These gases (Ar, He, Xe, $N_2$, and $CO_2$) have the common disadvantage in that they are not adsorbed to Ru as easily as oxygen. This implies that the absolute value of their heat of adsorption on Ru is smaller than that of oxygen. It is reasonable to consider that the density of adsorption of oxygen on the surface of Ru is determined mainly by the partial pressure of oxygen. One effective way to improve conformality is to increase the supply of a gas hardly adsorbable to Ru, thereby decreasing the partial pressure of oxygen. This is accomplished by controlling the amount of exhaust such that the total pressure in the film-forming chamber is kept constant (at 5 Torr, for instance).

For good conformality in practice, it is necessary to control the partial pressure of oxygen in the film-forming chamber so that it is as low as 0.01 Torr, as shown in FIG. 13. It is also necessary to adjust the position of the shower head and the amount of gas supply so that the partial pressure of oxygen does not fluctuate on the wafer. Despite such adjustment, it may be difficult to keep the partial pressure of oxygen constant when the partial pressure of oxygen is lower than 0.003 Torr, because under such conditions, the thickness of the Ru film varies greatly on the wafer.

In the above-mentioned experiments, $Ru(C_5H_4C_2H_5)_2$ is used as a typical precursor for CVD. The same effect may also be produced even if it is replaced by any of $Ru(OD)_3$, $Ru(CH_3C_5H_4)_2$, $Ru(C_5H_5)_2$, and $Ru(C_{11}H_{19}O_2)_3$. (The latter three are solid at room temperature.) The gases to be introduced to reduce the partial pressure of oxygen include Ar, Ne, He, Xe, $N_2$, and $CO_2$, which are hardly adsorbed to Ru. The same effect is also produced by a non-polar hydrocarbon compound without multiple bonds. In the above-mentioned experiments, oxygen is used to decompose the precursor for CVD; the same effect is also produced if the oxygen is replaced by an oxidizing gas such as $N_2O$, $H_2O$, NO, and $O_3$. The optimal substrate temperature is approximately 200–400° C.

A ruthenium film with good conformality may also be formed by supplying a gas which is readily adsorbed to Ru surface in the following manner. In this case, the organoruthenium compound as a precursor is $Ru(EtCp)_2$, the oxidizing gas is oxygen, and the gas readily absorbable to Ru surface is THF. The precursor is supplied by the liquid bubbling method employing argon as a carrier gas. The procedure begins with the formation of a Ru seed layer (20 nm thick) by sputtering, and then the desired film is formed. The seed layer reduces the incubation period required for growth nucleation. The supply of oxygen, the supply of THF, and the supply of argon (not as a carrier gas) are controlled so that oxygen and THF each have a desired partial pressure. The pressure in the film-forming chamber is kept at 5 Torr by controlling the amount of exhaust.

FIG. 14 shows how the activation energy for decomposition reaction of $Ru(EtCp)_2$ varies with the partial pressure of oxygen and the partial pressure of THF. It is noted from FIG. 14 that a shift takes place from the decomposition mechanism with an activation energy of about 1.4 eV to the decomposition mechanism with an activation energy of about 0.4 eV at a certain partial pressure of oxygen, which increases with the increasing partial pressure of THF. It is also noted that the lower the partial pressure of oxygen and the higher the partial pressure of THF, the better the conformality. Hatching in FIG. 14 denotes the region for high step coverage (with an aspect ratio of 15).

It is noted that Ru film with good coverage is formed in a deep hole with an aspect ratio of 15 when the supply of THF liquid is 5 sccm, the supply of oxygen gas is 50 sccm, and the supply of total argon (including carrier gas) is 900 sccm. Under these conditions, the partial pressure of oxygen and THF in the film-forming chamber are 0.11 Torr and 2.95 Torr, respectively. This implies that the density of oxygen adsorbed on the surface is determined by both the partial pressure of oxygen and the partial pressure of THF. The density of oxygen adsorbed on the surface can be reduced by increasing the partial pressure of THF. The same result may be obtained when THF is replaced by carbon monoxide (CO), ethylene ($C_2H_4$), or acetylene ($C_2H_2$). As shown in FIG. 14, it is possible to reduce the density of oxygen adsorbed on the Ru surface by increasing their partial pressure.

The results shown in FIG. 14 may be better understood by examining the adsorption of mixed gas on Ru surface. Gases such as THF, CO, $C_2H_4$, and $C_2H_2$ are characterized by a larger absolute value of heat of adsorption on Ru surface than the above-mentioned inert gases such as Ar, Ne, Xe, $N_2$, and $CO_2$. This implies that they are readily adsorbed to the Ru surface. In general, when a mixed gas is adsorbed to a metal surface, the density of individual gases adsorbed is determined by the partial pressure of each gas, heat of adsorption, density of saturated adsorption, substrate temperature, and surface roughness. In other words, if a gas, such as THF which is readily adsorbed to Ru surface, is introduced and its partial pressure is controlled, it is possible to change the ratio of the density of an oxidizing gas adsorbed to Ru surface to the density of other gases adsorbed to Ru surface.

Reducing the density of oxygen adsorbed to the Ru surface by introducing a gas which is readily adsorbed to the Ru surface is an effective way to improve conformality. The introduction of these gases makes it possible to set the optimal oxygen partial pressure above 0.01 Torr, and this offers the advantage of keeping the distribution of oxygen partial pressure uniform on the wafer and to minimize the variation of Ru film thickness and step coverage on the water surface.

In the above-mentioned experiments, $Ru(C_5H_4C_2H_5)_2$ was used as a typical precursor for CVD. The same effect is also produced if it is replaced by any of $Ru(OD)_3$, $Ru(CH_3C_5H_4)_2$, $Ru(C_5H_5)_2$, and $Ru(C_{11}H_{19}O_2)_3$. (The latter three are solid at room temperature.) The gases to be introduced to reduce the density of oxygen adsorbed on Ru include THF, CO, $C_2H_4$, and $C_2H_2$ (with polar, multiple bond structure) which are readily adsorbed to Ru. Those which are liquid at room temperature can also be used if they have a boiling point lower than 150° C. and can be vaporized for supply.

The condition for high conformality is indicated by the hatched region in FIG. 14. Also, since the above-mentioned organoruthenium compound itself, such as $Ru(C_5H_4C_2H_5)_2$, is readily adsorbed to the Ru surface, its increased supply decreases the amount of oxygen adsorbed and increases the step coverage. For improved conformality, the amount of organoruthenium compound should be more than about one-fifth of the amount of oxygen in terms of gas. This leads to an increased consumption of Ru precursor and an increased production cost. In the above-mentioned experiments, oxygen is used to decompose the precursor for CVD; the same effect is also be produced if the oxygen is replaced by an oxidizing gas such as $N_2O$, $H_2O$, NO, and $O_3$. The optimal substrate temperature is approximately 200–400° C. irrespective of the kind of organoruthenium compound and oxidizing gas and other gas used.

BRIEF DESCRIPTION OF THE DRAWINGS

For the present invention to be clearly understood and readily practiced, the present invention will be described in conjunction with the following figures, wherein like reference characters designate the same or similar elements, which figures are incorporated into and constitute a part of the specification, wherein.

DETAILED DESCRIPTION OF THE INVENTION

It is to be understood that the figures and descriptions of the present invention have been simplified to illustrate elements that are relevant for a clear understanding of the present invention, while eliminating, for purposes of clarity, other elements that may be well known. Those of ordinary skill in the art will recognize that other elements are desirable and/or required in order to implement the present invention. However, because such elements are well known in the art, and because they do not facilitate a better understanding of the present invention, a discussion of such elements is not provided herein. The detailed description will be provided hereinbelow with reference to the attached drawings.

FIRST EXEMPLARY EMBODIMENT (EXAMPLE 1)

Figure 1:
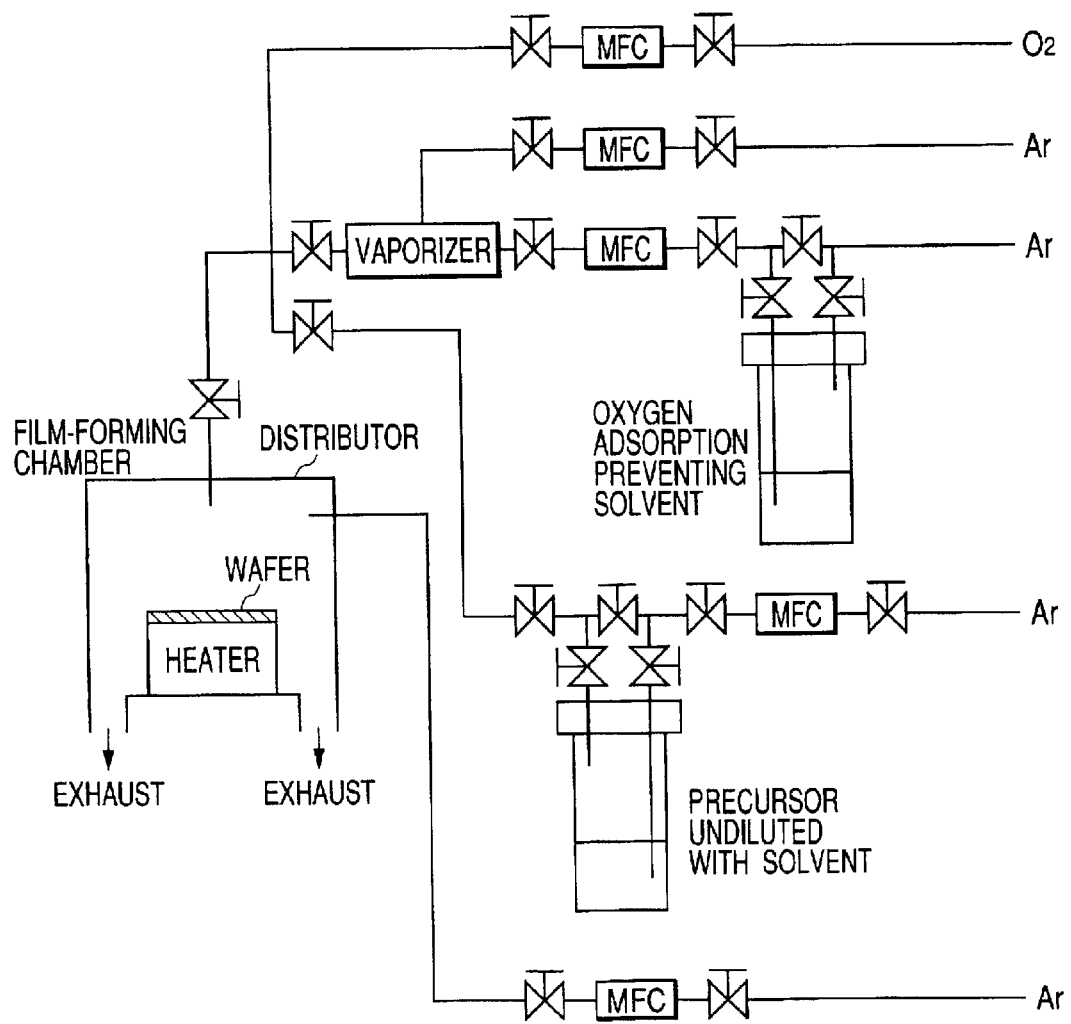
FIG. 1 shows the construction of an apparatus used in Example 1 of the present invention.

This example demonstrates how to make Ru electrodes for a high dielectric constant capacitor by chemical vapor deposition. An apparatus used in this example is schematically shown in FIG. 1. The precursor container contains an organoruthenium compound as a precursor. The precursor is shown as being transferred by bubbling together with argon (as a carrier gas) whose flow rate is controlled by a mass flow controller (MFC). Alternatively, the precursor may be transferred by solid sublimation method. In this case, the container is provided with a heater which is not shown. Before the film-forming chamber, the precursor is mixed with oxygen (as a reacting gas) and an oxygen adsorption preventing gas. The latter may be THF, which is liquid at normal temperature. In this case, THF is supplied under regulation by a liquid mass flow controller. After vaporization with heating, THF gas is transferred together with argon (as a carrier gas). Thus, the precursor, oxygen, oxygen adsorption preventing gas, and carrier gas enter the film-forming chamber through a distributor. After heating, they are supplied to a wafer. The partial pressure of each gas in the film-forming chamber is controlled by regulating the flow rate of an inert gas (Ar) supplied through another route and also by keeping the total pressure constant in the film-forming chamber (via the exhaust).

The procedure explained in the following is designed to form Ru electrodes on a substrate having deep holes, 130 nm in diameter and 2000 nm in depth, by chemical vapor deposition. The deep hole has an aspect ratio of 15. First, a seed layer of Ru is formed on the substrate by sputtering. The surface of the substrate (as the underlayer of the seed layer) may be an insulating layer of $SiO_2$, a layer of plug metal material, an adhesion layer between the insulating layer and the seed layer, or a film of high dielectric constant material. Sputtering is performed on the substrate kept at 300° C. and placed away from the electrode (in the long throw mode), When the deposit of Ru reaches 50 nm on the flat part at the top of the hole, a seed layer, no more than about 1 nm thick, is formed on the sidewall of the hole.

The organoruthenium compound is preferably bis(ethylcyclopenta-dienyl)ruthenium ($Ru(EtCp)_2$ or $Ru(C_2H_5C_5H_4)_2$). It is held in a constant temperature bath at 50° C., and its vapor is transferred by an inert gas (argon) at a constant flow rate (100 sccm in this example). The supply of the precursor can be controlled by adjusting the temperature of the constant temperature bath and the flow rate of argon. The reaction chamber is fed with oxygen (at a flow rate of 50 sccm) for decomposition of the precursor. The reaction chamber is fed also with THF to control the amount of oxygen adsorbed to the seed layer. Although THF is liquid at room temperature, it can be supplied to the reaction chamber after vaporization by heating in a constant temperature bath at 80° C. or above.

The total pressure in the reaction chamber is kept at 5 Torr by introduction of an inert gas (argon) through another route at a flow rate of 800 sccm. Under this condition, the partial pressure of oxygen and THF in the reaction chamber is 0.11 Torr and 2.95 Torr, respectively. The partial pressure of each gas in the film-forming chamber is defined as the product of the total pressure multiplied by the mole fraction of each component in the mixture gas of organoruthenium compound, oxidizing age, inert gas, and oxygen adsorption preventing gas.

Under the above-mentioned conditions, a Ru film is formed on the seed layer by chemical vapor deposition. According to the process of the present invention, it is possible to form a film with good conformality on the bottom of a deep hole at a film-forming rate higher than 10 nm/min without an incubation period. A desired film may be formed on a substrate whose temperature ranges from 200° C. to 450° C. This offers the advantage of reducing the time required to control the substrate temperature in the apparatus of single-wafer type and, hence, reducing the film-forming time.

In the case where the deep hole has an aspect ratio smaller than 15, it is possible to form the desired film with good conformality under the condition for higher reaction probability (or growth rate) if the partial pressure of THF is reduced or the partial pressure of oxygen is increased. Moreover, in the case where the deep hole has an aspect ratio larger than 15 as is encountered when the upper electrode is formed, it is possible to achieve 100% conformality with a sacrifice of reaction probability (wherein the "reaction probability" is a measure of the % of precursor used) if the partial pressure of THF is increased or the partial pressure of oxygen is decreased. In order to obtain the desired film, it is necessary to keep the partial pressure of oxygen in the range of 0.01 Torr to 1.0 Torr and the partial pressure of THF in the range of 0.1 Torr to 10.0 Torr. In addition, since the ruthenium film is grown by the oxidation decomposition reaction which is limited by the amount of oxygen adsorbed, the organoruthenium compound should be supplied in an amount according to the amount of oxygen adsorbed and the area of the substrate. For example, a supply rate higher than $1 \times 10^{-4}$ mol/min is adequate for substrates 8 inches in diameter.

Examples of the oxygen adsorption preventing gas include THF, toluene, methanol, ethanol, 1-propanol, 2-propanol, isobutyl alcohol, 1-butanol, 2-butanol, diethyl ether, diisopropyl ether, tetrahydrofuran, tetrahydropyran, 1,4-dioxane, acetone, and methyl ethyl ketone, which are in vapor form. The above-mentioned seed layer produces its effect when it is formed from platinum group metal (such as Ru, Rh, Pd, Os, Ir, and Pt) or from Co, Fe, etc., and/or an alloy thereof, which have strong catalytic activity. The same effect is produced either in the case where the oxygen adsorption preventing gas is used or in the case where the above-mentioned metal is used.

In addition to $Ru(EtCp)_2$, the organoruthenium compounds that may be used include: bis(cyclopentadienyl)ruthenium ($Ru(C_2H_5)_2$); bis(methylcyclopentadienyl)ruthenium ($Ru(CH_3C_5H_4)_2$); and tris (dipivaloylmethanate) ruthenium ($Ru(C_{11}H_{19}O_2)_3$). Their mechanism of chemical vapor deposition is identical with that of $Ru(EtCp)_2$. It is possible to attain the optimal substrate temperature and the optimal oxygen partial pressure by the introduction of the oxygen adsorption preventing gas. For each organoruthenium compound, it is necessary to adjust the substrate temperature, the partial pressure of oxygen, and the partial pressure of oxygen adsorption preventing gas as shown in Table 1.

SECOND EXEMPLARY EMBODIMENT (EXAMPLE 2)

This example demonstrates how to make Ru electrodes for a high dielectric constant capacitor by chemical vapor deposition. The apparatus and procedure are explained in the following. The apparatus in this example employs an organoruthenium compound in liquid form after dilution with an oxygen adsorption preventing solvent.

Figure 2:
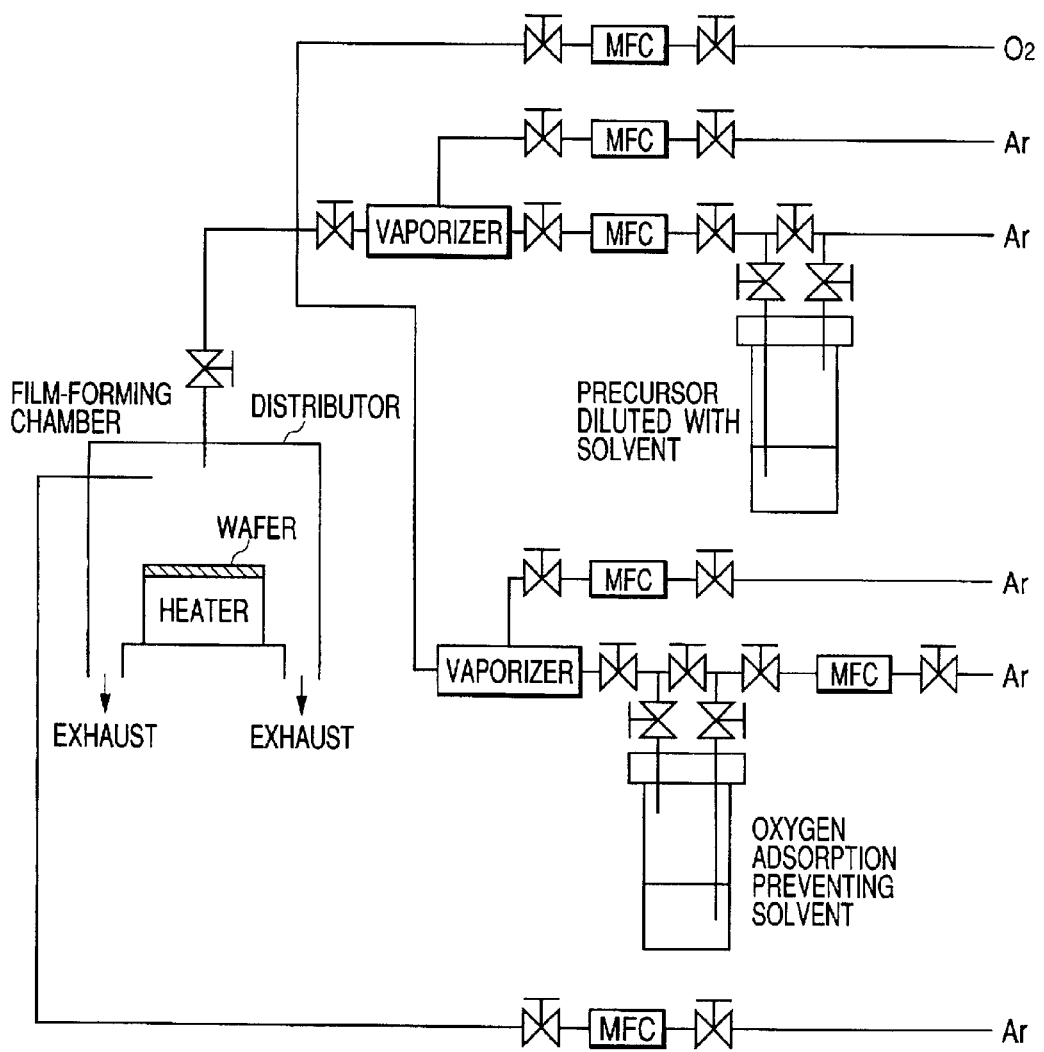
FIG. 2 shows the construction of an apparatus used in Example 2 of the present invention.

An apparatus used in this example is schematically shown in FIG. 2. The precursor container contains an organoruthenium compound as a precursor which has been diluted with an oxygen adsorption preventing solvent. The diluted precursor is vaporized by heating in a vaporizer, with its flow rate controlled by a liquid mass flow controller (MFC), and is transferred by argon as a carrier gas. Before the film-forming chamber, it is mixed with oxygen (as a reactant gas) and an oxygen adsorption preventing gas supplied by a separate route. The precursor, oxygen, oxygen adsorption preventing gas, and carrier gas are supplied to a heated wafer through a distributor. The oxygen adsorption preventing gas, which is introduced separately from the diluted precursor, permits the Ru film to be formed in deep holes with different aspect ratios under the optimal conditions for efficient consumption of the precursor. The partial pressure of each gas in the film-forming chamber is adjusted by controlling the flow rate of inert gas supplied through a separate route and keeping constant the total pressure in the film-forming chamber.

The procedure explained in the following is designed to form Ru electrodes by chemical vapor deposition. The oxygen adsorption preventing gas (explained in Example 1) is selected from a solvent which is liquid at normal pressure and has a high solubility for the organoruthenium compound. Examples of such solvents include THF, toluene, alcohols, ethers, and ketones, which have been described in Example 1. The organoruthenium compound is diluted with one of these solvents, and the resulting solution is supplied in the form of vapor after heating. This method permits better supply control. The supply of the solution is controlled separately from the supply of the oxygen adsorption preventing gas. In this way it is possible to establish the film-forming condition as shown in Example 1.

For example, $Ru(EtCp)_2$ as an organoruthenium compound is diluted with THF to give a solution of $1\times10^{-4}$ mol/L in concentration, and this solution is vaporized at 150° C. and then introduced into the reaction chamber. The supply of the liquid precursor is 2 sccm. This is equivalent to $2\times10^{-4}$ mol/min of $Ru(EtCp)_2$. The supply of argon as a carrier gas for the vaporized precursor is 150 sccm and the supply of oxygen is 50 sccm. In addition, the film-forming chamber is fed with argon (as an inert gas to control the partial pressure of each gas) at a flow rate of 750 sccm and THF (in vapor form) at a flow rate of 3 sccm. The total pressure in the reaction chamber is kept at 5 Torr, so that the partial pressure of oxygen and THF gas in the reaction chamber is 0.11 Torr and 2.95 Torr, respectively.

Under the above-mentioned conditions, a Ru film is formed by chemical vapor deposition on a substrate on which a seed layer has been formed as explained in Example 1. According to the process of the present invention, it is possible to form a film with good conformality on the bottom of a deep hole at a film-forming rate higher than 10 nm/min without an incubation period. A desired film may be formed on a substrate whose temperature ranges from 200° C. to 450° C. This offers the advantage of reducing the time required to control the substrate temperature in the apparatus of single-wafer type and, hence, reducing the film-forming time.

In the case where the deep hole has an aspect ratio smaller than 15, it is possible to form the desired film with good conformality under the condition for higher reaction probability (or growth rate) if the partial pressure of THF is reduced (by reducing the supply of the diluted precursor solution) or the partial pressure of oxygen is increased. Moreover, in the case where the deep hole has an aspect ratio larger than 15 as is encountered when the upper electrode is formed, it is possible to achieve 100% conformality with sacrifice of reaction probability (% of precursor used) if the partial pressure of THf is increased or the partial pressure of oxygen is decreased.

In order to obtain the desired film, it is necessary to keep the partial pressure of oxygen in the range of 0.01 Torr to 1.0 Torr as in Example 1 and the partial pressure of THF in the range of 0.1 Torr to 10.0 Torr. In addition, since the ruthenium film is grown by the oxidation decomposition reaction which is limited by the amount of oxygen adsorbed, the organoruthenium compound should be supplied in an amount according to the amount of oxygen adsorbed and the area of the substrate. For example, a supply rate higher than $1\times10^{-4}$ mol/min is adequate for substrates 8 inches in diameter. For this purpose, it is possible to establish the optimal condition by supplying the diluted precursor at a flow rate of $1\times10^{-4}$ mol/min and supplying the THF vapor at a flow rate of $1\times10^{-4}$ mol/min through a separate route. Alternatively, it is also possible to dilute the organoruthenium compound in THF solvent such that the resulting concentration optimizes the partial pressure of THF gas and the supply of the precursor. Either method will improve the efficiency of precursor consumption and contributes to reduction in production cost.

The above-mentioned seed layer may be formed from, in addition to Ru, any metal listed in Example 1. The organoruthenium compound includes, in addition to $Ru(EtCp)_2$, those pentadienyl compounds and β-diketone compounds listed in Example 1. These compounds have the same mechanism of chemical vapor deposition as $Ru(EtCp)_2$. For each organoruthenium compound, it is necessary to adjust the substrate temperature, the partial pressure of oxygen, and the partial pressure of oxygen adsorption preventing gas as shown in Table 1.

THIRD EXEMPLARY EMBODIMENT (EXAMPLE 3)

This example demonstrates a process for forming a high dielectric constant capacitor in which three-dimensional Ru electrodes are formed using the process/apparatus explained with respect to Examples 1 and 2. The process consists of steps of making deep holes in a silicon oxide film that permits easy microfabrication and depositing Ru therein by chemical vapor deposition, as schematically shown in FIG. 3.

Figure 3A:
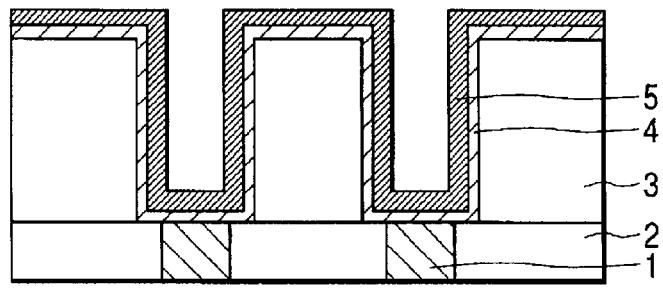
FIG. 3 is a sectional view showing the steps of forming a semiconductor device in Example 3 of the present invention.
Figure 3B:
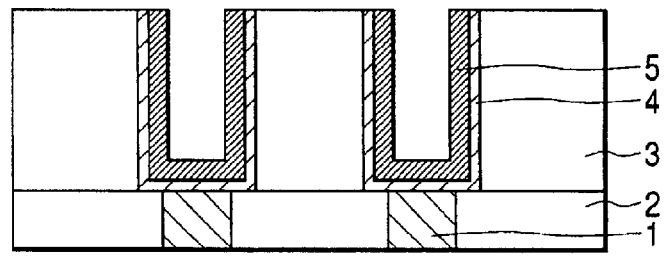
Figure 3C:
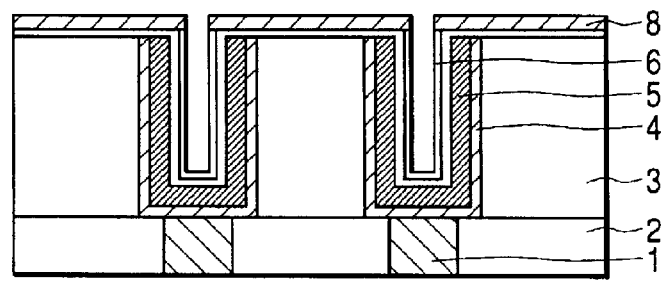
Figure 3D:
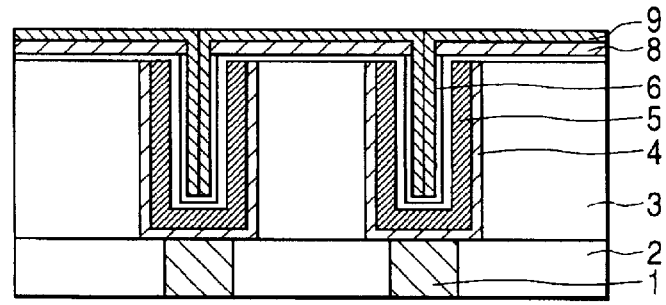
Figure 4A:
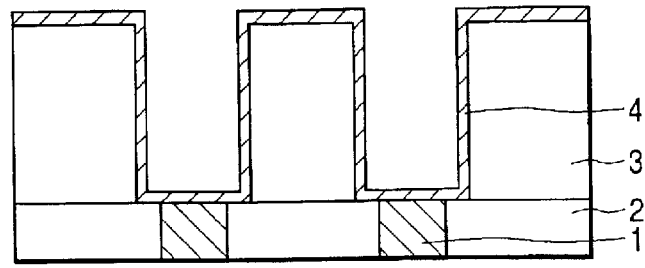
FIG. 4 is a sectional view showing the steps of forming a semiconductor device in Example 4 of the present invention.
Figure 4B:
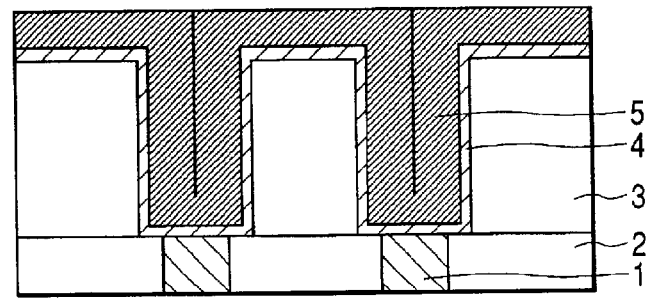
Figure 4C:
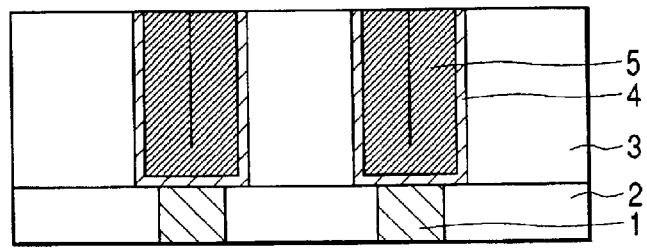
Figure 4D:
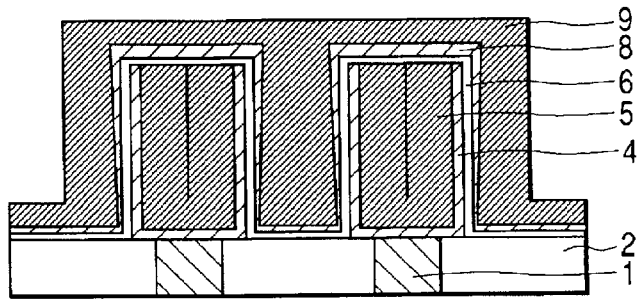
Figure 5A:
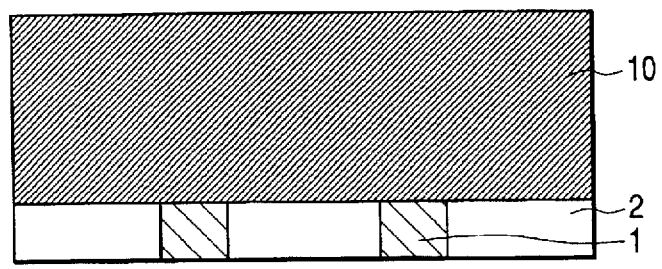
FIG. 5 is a sectional view showing the steps of forming a semiconductor device in Example 5 of the present invention.
Figure 5B:
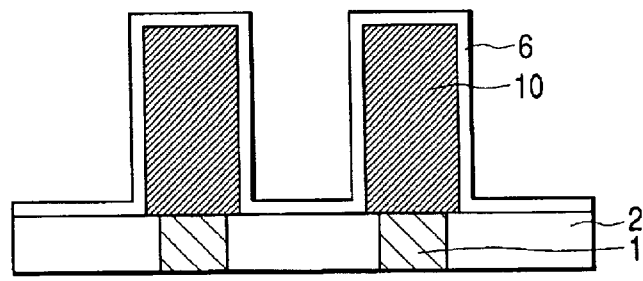
Figure 5C:
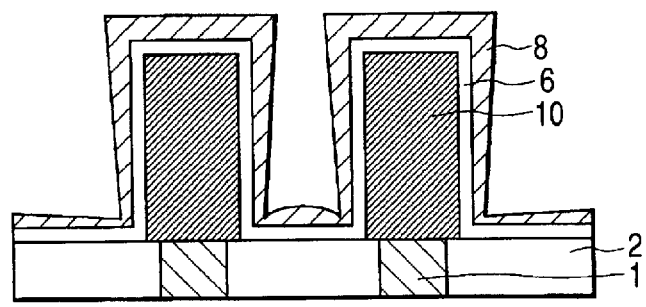
Figure 5D:
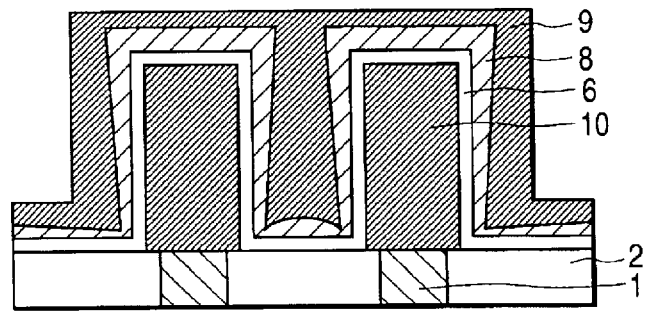
Figure 6:
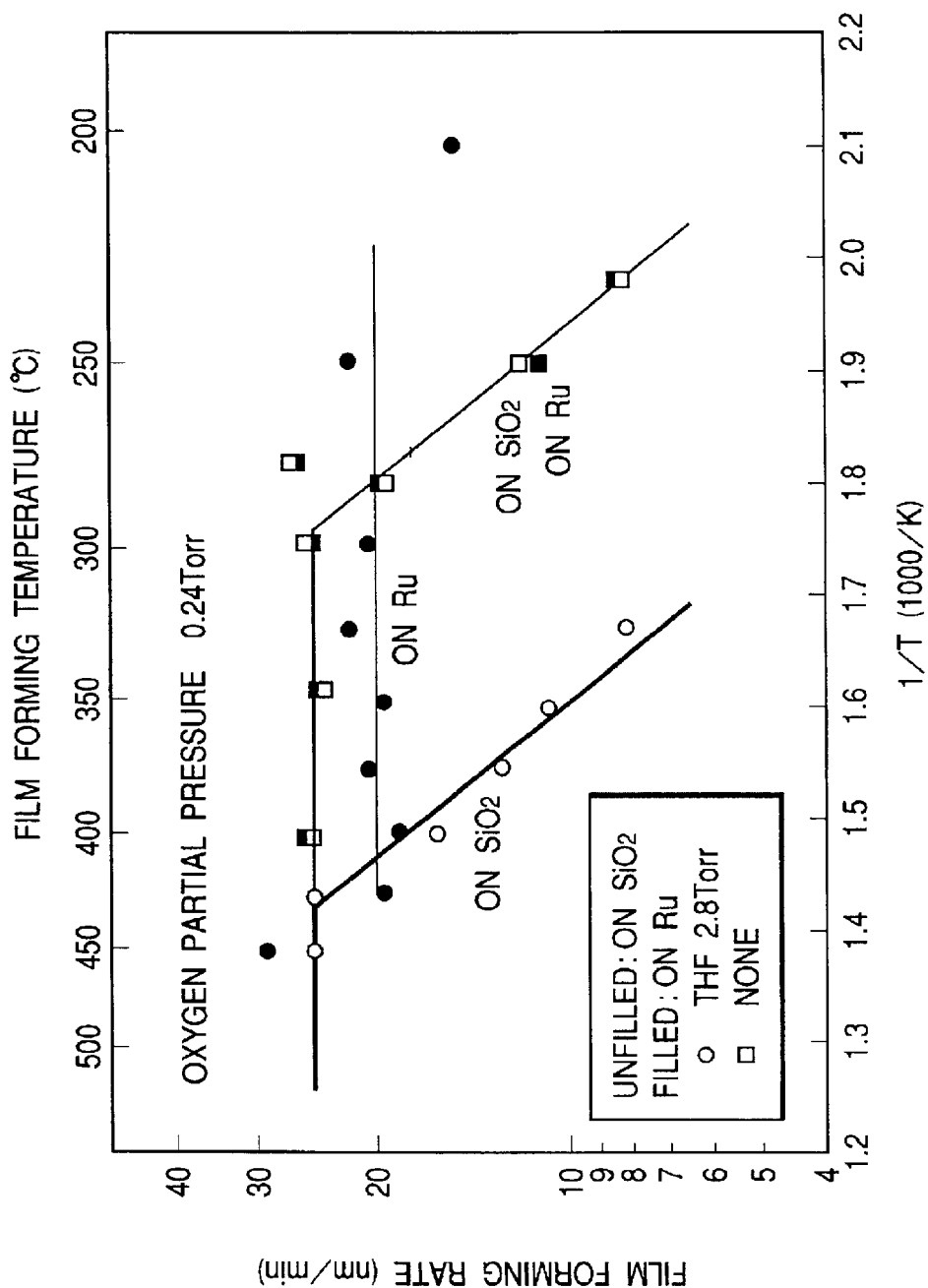
FIG. 6 is a graph showing how the rate of ruthenium film forming depends on the film-forming temperature when parameters are changed for the oxygen adsorption preventing gas and the substrate.
Figure 7A:
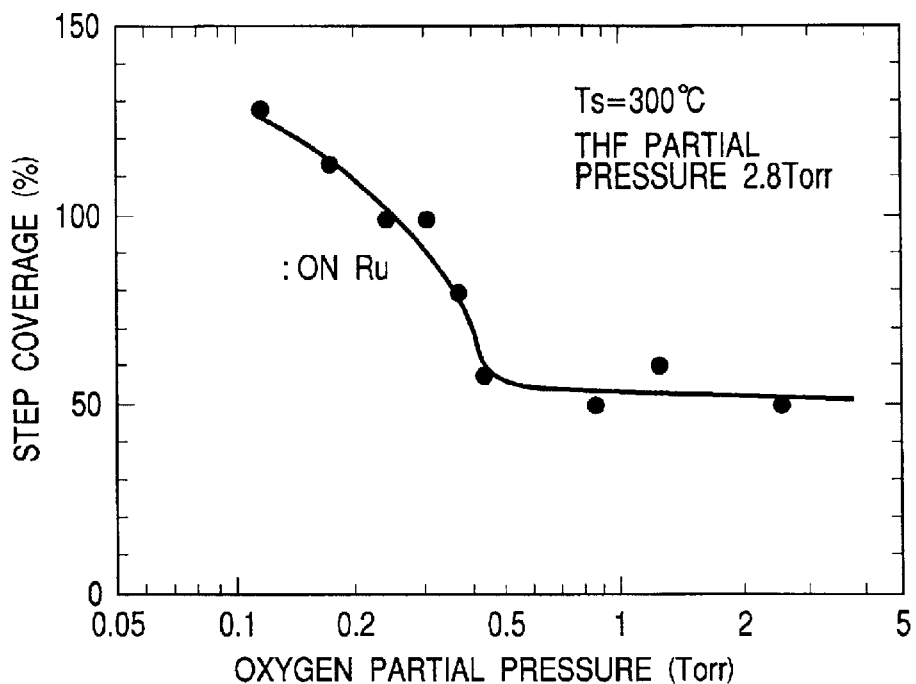
FIG. 7 is a graph showing how the partial pressure of oxygen affects the step coverage of Ru film and the film forming rate.
Figure 7B:
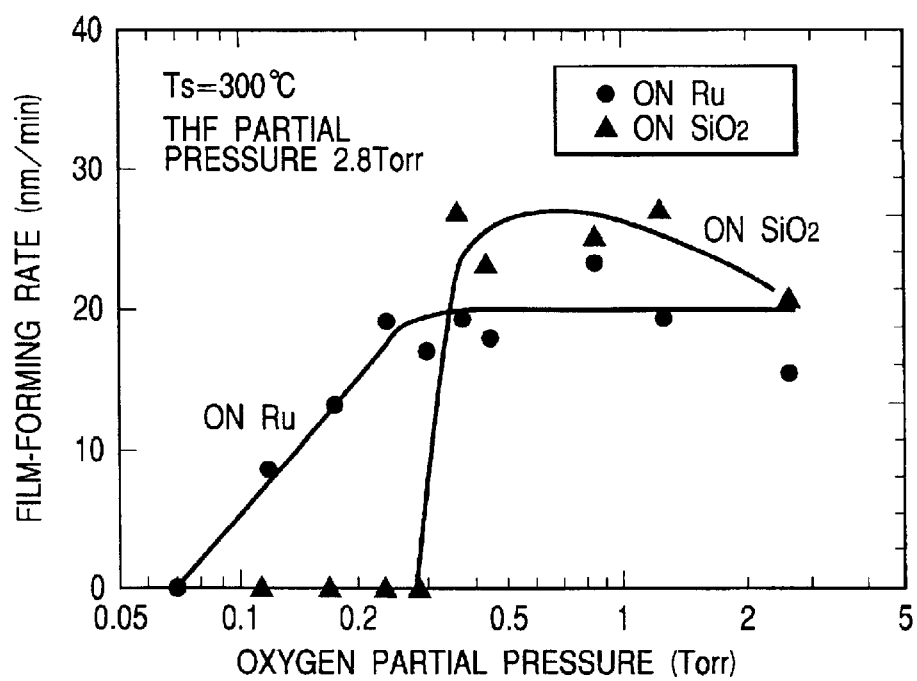
Figure 8A:
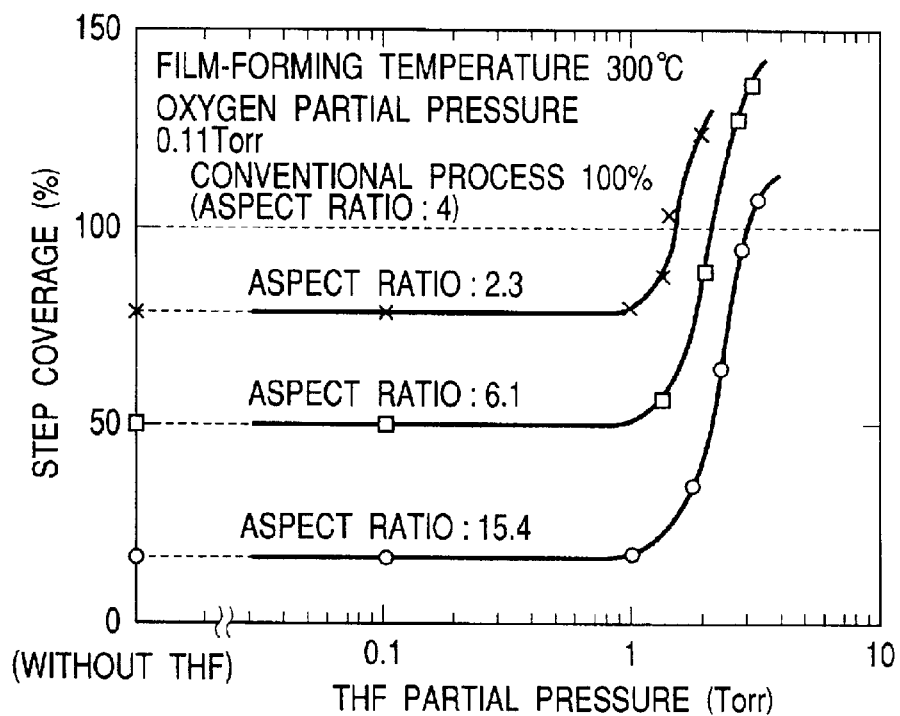
FIG. 8 is a graph showing how the partial pressure of oxygen adsorption preventing gas affects the step coverage of Ru film and the film forming rate.
Figure 8B:
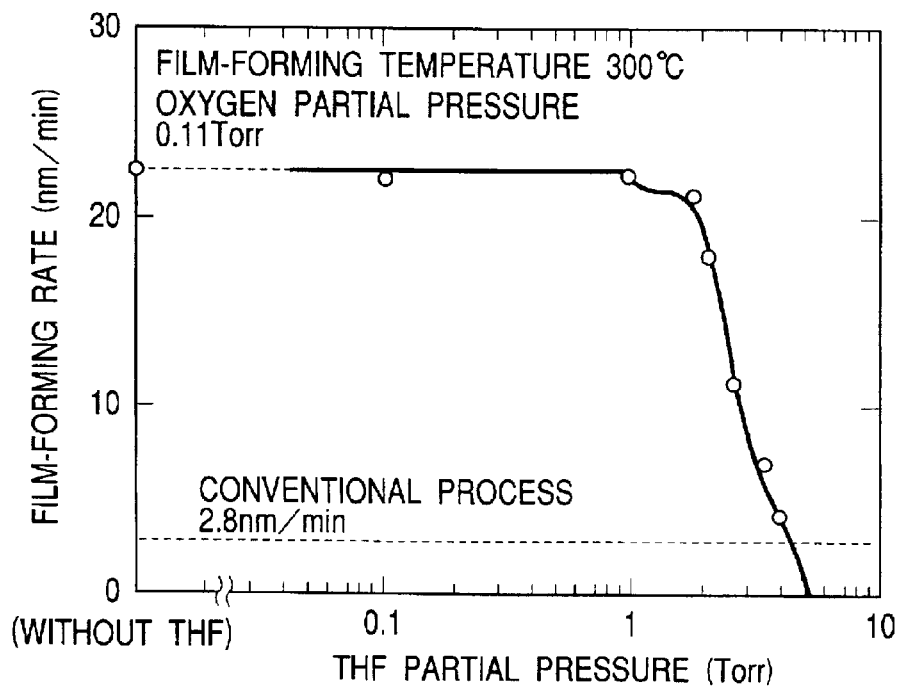

In FIG. 3(a), there are shown a plug 1 of titanium nitride and a plug insulating interlayer 2 of $SiO_2$. The first step begins with depositing on these structures a 1500-nm thick capacitor insulating interlayer 3 of $SiO_2$ from monosilane by plasma CVD. Thereafter, cylindrical holes (with round openings) reaching the plug insulating interlayer 2 are formed in the capacitor insulating interlayer 3 by well-known photolithography and dry etching. The cylinder may also have an elliptic or rectangular opening. In the case of Giga-bit memory, the opening should have a diameter (or a short side of a rectangle) smaller than 130 nm. With the resist removed, long throw sputtering is performed to form a lower seed layer 4 of Ru in the deep hole and, subsequently, a lower ruthenium electrode 5 (20 nm thick) is formed. The procedure for making the seed layer and lower ruthenium electrode is the same as that explained in Examples 1 and 2. In this way it is possible to deposit the lower ruthenium electrode with good conformality in a short time.

In the next step, shown in FIG. 3(*b*), the ruthenium film which has been deposited on the insulating interlayer is removed by chemical mechanical polishing or sputtering so as to electrically isolate adjacent capacitors. Incidentally, it is desirable to form a film of $Si_3N_4$ on the surface of the capacitor insulating interlayer 3 in a prior step. This film functions as a stopper for chemical mechanical polishing. This stopper may be removed or left after chemical mechanical polishing.

In addition, the deep hole should preferably be filled with silicon oxide so as to prevent particles from falling into the deep hole during chemical mechanical polishing. This silicon oxide should be removed after chemical mechanical polishing. The lower ruthenium electrode should preferably be heated (to be made compact) for protection from deformation in post heat-treatment and for removal of oxygen from the Ru film. For completeness, this step may be accomplished by heating in an inert gas atmosphere (argon) at 700° C. for 1 minute. The heating temperature may be 450–700° C., preferably 500–700° C. The heating period is usually 1–5 minutes, preferably 1–2 minutes.

In the third step shown in FIG. 3(*c*), an oxide dielectric material 6 of $Ta_2O_5$ (10 nm thick) is deposited by chemical vapor deposition. This thickness is equivalent to 0.8 nm in terms of $SiO_2$ film. Alternatively, an oxide dielectric material 6 of BST (20 nm thick) is deposited by chemical vapor deposition. This thickness is equivalent to 0.4 nm in terms of $SiO_2$ film. In the case of BST, the capacitor insulating interlayer 3 may have a thickness larger than 700 nm. The BST film is preferably deposited under the following conditions:

Ba is supplied as $Ba(DPM)_2$ or $Ba((CH_3)_3CCOCH_2COC(CH_3)_3)_2$ (barium dipivaloyl methane)

Sr is supplied as $Sr(DPN)_2$ or $Sr((CH_3)_3CCOCH_2COC(CH_3)_3)_2$ (strontium dipivaloyl methane)

Ti is supplied as $Ti(OC_3H_7)_4$ (triisopropoxide titanium)

The raw materials are fed by liquid bubbling with argon as a carrier gas. The temperature for deposition is 400° C., and the pressure for deposition is 0.5 Torr. The deposition step is followed by heat treatment at 550–700° C. so that the oxide dielectric material is crystallized.

Subsequently, an upper seed layer 8 of Ru is formed in the deep hole (70 nm in diameter and 1500 nm deep, with an aspect ratio of 22) by long throw sputtering as explained in Example 1 or 2. In the case where BST is deposited as the oxide dielectric material, an upper seed layer 8 of Ru is formed in the deep hole (50 nm in diameter and 700 nm deep, with an aspect ratio of 14) by long throw sputtering as explained in Example 1. Further, an upper ruthenium electrode 9 is deposited in the deep hole by chemical vapor deposition as explained in Example 1 or 2. In the case of deep holes with an aspect ratio in excess of 15, it is possible to secure good conformality by increasing the partial pressure of the oxygen adsorption preventing gas as explained in Examples 1 and 2. In this way it is possible to deposit the upper ruthenium electrode in the deep hole in a reduced amount of time.

Figure 9:
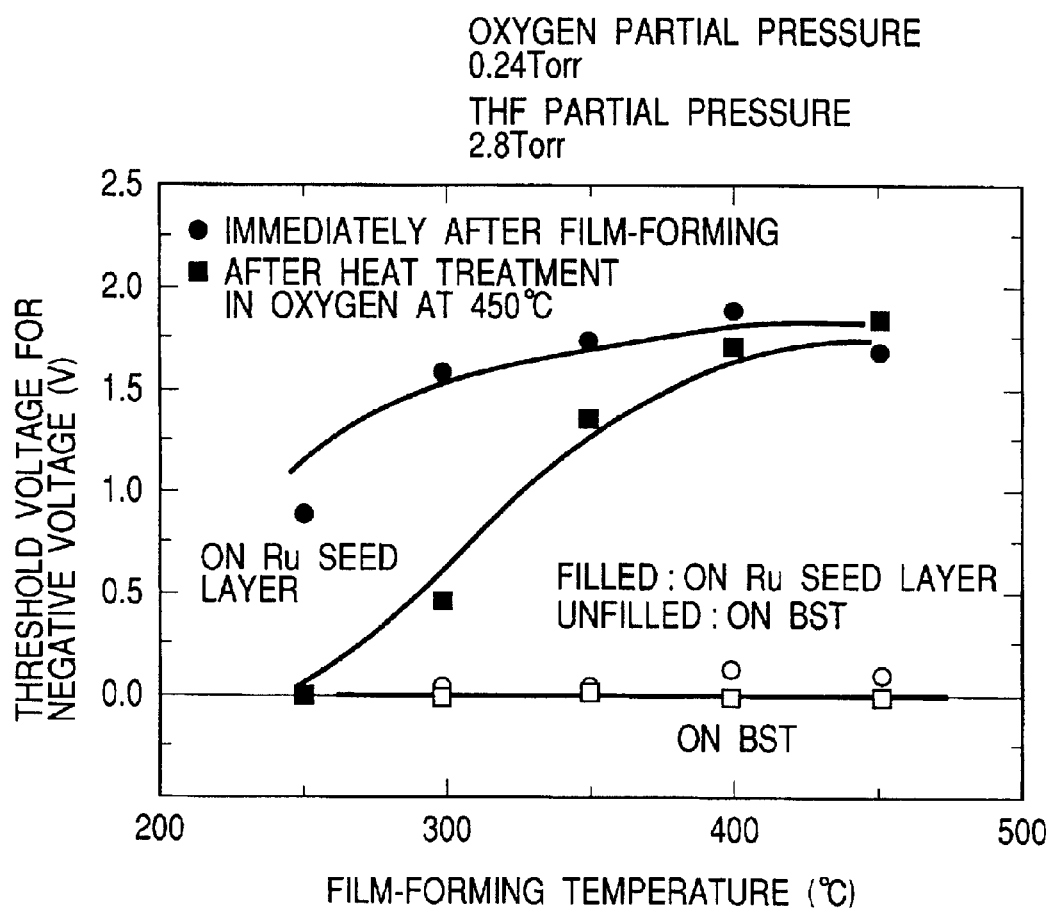
FIG. 9 is a graph showing the relationship between the threshold voltage of the capacitor and the temperature of the heat treatment in an oxidizing atmosphere which is carried out after the upper electrode has been formed.

The procedure is completed by heat treatment in an oxidizing atmosphere at 300–500° C. The capacitor formed in this manner has low leakage current. FIG. 9 shows how the temperature of the heat treatment in an oxidizing atmosphere, which is carried out after the upper electrode has been formed, affects the threshold voltage of the capacitor (when a positive voltage is applied to the lower electrode for a leakage current of $10^{-7}$ $A/cm^2$). FIG. 9 also shows the result obtained from a capacitor produced by the conventional technology.

In the case where the upper Ru electrode is formed by chemical vapor deposition on the conventional high dielectric constant film, the threshold voltage does not change after heat treatment in an oxidizing atmosphere because the oxide insulating material is deprived of oxygen when the raw material undergoes decomposition reaction. Hence, the threshold voltage is initially very small when the film is formed. By contrast, the capacitor produced by the process of the present invention has a higher threshold voltage immediately after the film has been formed as compared with that formed by the conventional technology, because the seed layer protects the oxide dielectric film. Moreover, as shown in FIG. 9, the heat treatment at 400° C. or above in an oxidizing atmosphere, which follows the step of film formation, produces the effect of reducing the leakage current below $1 \times 10^{-7}$ $A/cm^2$ for an applied voltage of 1 V.

The above-mentioned seed layer may be formed from not only Ru but also any metal shown in Example 1. The seed layer may be an extremely thin film whose thickness is not necessarily continuous. The oxide dielectric film may be formed from not only BST and $Ta_2O_5$ but also strontium titanate, lead titanate zirconate, and bismuth-based dielectric material. The organoruthenium compound includes not only $Ru(EtCp)_2$ but also cyclopentadienyl compounds and β-diketone compounds as shown in Example 1. These compounds undergo chemical vapor deposition in the same way as $Ru(EtCp)_2$. For each organoruthenium compound, it is necessary to adjust the substrate temperature, the partial pressure of oxygen, and the partial pressure of oxygen adsorption preventing gas as shown in Table 1.

FOURTH EXEMPLARY EMBODIMENT
(EXAMPLE 4)

This example demonstrates a process for forming a high dielectric constant capacitor in which Ru electrodes are formed by the process/apparatus explained in Examples 1 and 2, as schematically shown in FIG. 4. The process comprises the steps of making a convex lower ruthenium electrode and a concave upper ruthenium electrode by chemical vapor deposition.

In FIG. 4(*a*), there are shown a plug 1 of titanium nitride and a plug insulating interlayer 2 of $SiO_2$. The first step begins with depositing on these materials a 1500-nm thick capacitor insulating interlayer 3 of $SiO_2$. Then, cylindrical holes (with round, elliptical or rectangular openings) reaching the plug insulating interlayer 2 are formed in the capacitor insulating interlayer 3 by well-known photolithography and dry etching. In the case of a Giga-bit memory, the opening should have a diameter (or a short side of a rectangle) smaller than 130 nm. With the resist removed, long throw sputtering is performed to form a lower seed layer 4 of Ru in the deep hole, as shown in FIG. 4(*a*).

Subsequently, chemical vapor deposition is performed to form the lower ruthenium electrode 5 (80 nm thick) over the entire surface, as shown in FIG. 4(*b*). The procedure for making the seed layer and lower ruthenium electrode is the same as that explained in Example 1 or 2. In this way, it is possible to fill the opening of the insulating interlayer.

In the next step, shown in FIG. 4(*c*), the ruthenium film which has been deposited on the insulating interlayer is removed by chemical mechanical polishing or sputtering so as to electrically isolate adjacent capacitors. It is desirable to form a film of $Si_3N_4$ on the surface of the capacitor insulating interlayer 3 in a prior step. This film functions as a stopper for chemical mechanical polishing. This stopper may be removed or left after chemical mechanical polishing.

The lower ruthenium electrode should preferably be heated (to be made compact) for protection from deformation in post heat-treatment and for removal of oxygen from the Ru film. To be complete, this step is accomplished by heating in an inert gas atmosphere (argon) at 450–700° C. for 1 minute. After filling with ruthenium film, the capacitor insulating interlayer 3 is removed. In this way, the convex lower ruthenium electrode may be formed.

Subsequently, an oxide dielectric material 6 of $Ta_2O_5$ (10 nm thick) is deposited by chemical vapor deposition. This thickness is equivalent to 0.8 nm in terms of $SiO_2$ film. Alternatively, an oxide dielectric material 6 of BST (20 nm thick) is deposited by chemical vapor deposition. This thickness is equivalent to 0.4 nm in terms of $SiO_2$ film. In the case of BST, the capacitor insulating interlayer 3 may have a thickness larger than 700 nm. The BST film is deposited under the same conditions as present in Example 3. The deposition step is followed by heat treatment at 550–700° C. so that the oxide dielectric material is crystallized.

Subsequently, an upper seed layer 8 of Ru is formed in the narrow concave part (110 nm apart and 1500 nm deep, with an aspect ratio of 13), between the convex parts, by long throw sputtering as explained in Example 1 or 2. In the case where BST is deposited as the oxide dielectric material, an upper seed layer 8 of Ru is formed in the narrow concave part (90 nm apart and 700 nm deep, with an aspect ratio of 8), between the convex parts, by long throw sputtering as explained in Example 1 or 2. Further, an upper ruthenium electrode 9 is deposited in the concave part by chemical vapor deposition as explained in Example 1 or 2. In this way it is possible to deposit the upper ruthenium electrode in the concave part in a reduced amount of time.

The procedure is completed by heat treatment in an oxidizing atmosphere at 300–500° C. The capacitor formed in this manner has low leakage current. FIG. 9 shows how the temperature of the heat treatment in an oxidizing atmosphere, which is carried out after the upper electrode has been formed, affects the threshold voltage of the capacitor (when a positive voltage is applied to the lower electrode for a leakage current of $10^{-7}$ A/cm$^2$). The capacitor produced by the process of the present invention has a higher threshold voltage immediately after the film has been formed as compared with that formed by the conventional technology, because the seed layer protects the oxide dielectric film. Moreover, the heat treatment at 400° C. or above in an oxidizing atmosphere, which follows the step of film formation, produces the effect of reducing leakage current below $1 \times 10^{-7}$ A/cm$^2$ for an applied voltage of 1 V.

The above-mentioned seed layer may be formed from not only Ru but also any metal shown in Example 1. The seed layer may be an extremely thin film whose thickness is not necessarily continuous. The oxide dielectric film may be formed from not only BST and $Ta_2O_5$ but also strontium titanate, lead titanate zirconate, and bismuth-based dielectric material. The organoruthenium compound includes not only $Ru(EtCp)_2$ but also cyclopentadienyl compounds and β-diketone compounds as shown in Example 1. These compounds undergo chemical vapor deposition in the same way as $Ru(EtCp)_2$. For each organoruthenium compound, it is necessary to adjust the substrate temperature, the partial pressure of oxygen, and the partial pressure of oxygen adsorption preventing gas as shown in Table 1.

FIFTH EXEMPLARY EMBODIMENT (EXAMPLE 5)

This example demonstrates, with reference to FIG. 5 (schematic sectional view), the formation of an upper ruthenium electrode by the process shown in Examples 1 and 2 after the convex lower electrode has been formed by sputtering. In FIG. 5(*a*), there are shown a plug 1 of titanium nitride and a plug insulating interlayer 2 of $SiO_2$. The first step begins with depositing on these materials a lower ruthenium electrode 10 (1500 nm thick). Thereafter, a storage node reaching the plug insulating interlayer 2 is formed by well-known photolithography and dry etching such that the lower ruthenium electrode 10 takes on a cylindrical (elliptical, rectangular, etc.) shape. In the case of a Giga-bit memory, the storage node should preferably have a diameter (or a short side of a rectangle) smaller than 130 nm. The lower ruthenium electrode should preferably be heated (to be made compact) for protection from deformation in post heat-treatment. For purposes of completeness, this step is accomplished by heating in an inert gas atmosphere (argon) at 700° C. for 1 minute.

Thereafter, an oxide dielectric material 6 of $Ta_2O_5$ (10 nm thick) is deposited by chemical vapor deposition. This thickness is equivalent to 0.8 nm in terms of $SiO_2$ film. Alternatively, an oxide dielectric material 6 of BST (20 nm thick) is deposited by chemical vapor deposition. This thickness is equivalent to 0.4 nm in terms of $SiO_2$ film. In the case of BST, the lower electrode 10 may have a thickness larger than 700 nm. The BST film is deposited under the same conditions as present in Example 3. The step of deposition is followed by heat treatment at 550–700° C. so that the oxide dielectric material is crystallized.

Subsequently, an upper seed layer 8 of Ru is formed on the oxide dielectric material 6 by long throw sputtering as explained in Example 1 or 2. Further, an upper ruthenium electrode 9 is deposited in the concave part by chemical vapor deposition as explained in Example 1 or 2. In this way it is possible to deposit the upper ruthenium electrode in the concave part in a reduced amount of time.

The procedure is completed by heat treatment in an oxidizing atmosphere at 300–500° C. The capacitor formed in this manner has low leakage current. FIG. 9 shows how the temperature of the heat treatment in an oxidizing atmosphere, which is carried out after the upper electrode has been formed, affects the threshold voltage of the capacitor (when a positive voltage is applied to the lower electrode for a leakage current of $10^{-7}$ A/cm$^2$). The capacitor produced by the process of the present invention has a higher threshold voltage immediately after the film has been formed as compared with that formed by the conventional technology, because the seed layer protects the oxide dielectric film. Moreover, the heat treatment at 400° C. or above in an oxidizing atmosphere, which follows the step of film formation, produces the effect of reducing the leakage current below $1 \times 10^{-7}$ A/cm$^2$ for an applied voltage of 1 V.

The above-mentioned seed layer may be formed from not only Ru but also any metal shown in Example 1. The seed layer may be an extremely thin film whose thickness is not necessarily continuous. The oxide dielectric film may be formed from not only BST and $Ta_2O_5$ but also strontium titanate, lead titanate zirconate, and bismuth-based dielectric material. The organoruthenium compound includes not only $Ru(EtCp)_2$ but also cyclopentadienyl compounds and β-diketone compounds as shown in Example 1. These compounds undergo chemical vapor deposition in the same way as $Ru(EtCp)_2$. For each organoruthenium compound, it is necessary to adjust the substrate temperature, the partial pressure of oxygen, and the partial pressure of oxygen adsorption preventing gas as shown in Table 1.

SIXTH EXEMPLARY EMBODIMENT (EXAMPLE 6)

Figure 10:
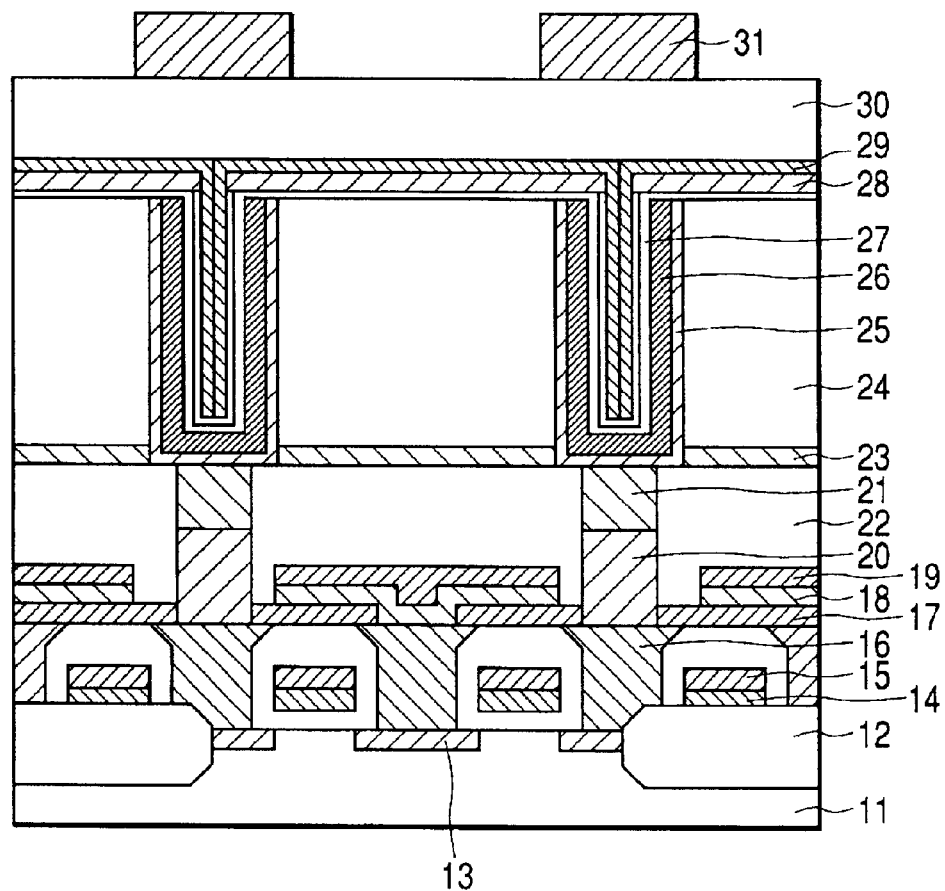
FIG. 10 is a sectional view showing a semiconductor device produced in Example 6 of the present invention.
Figure 11A:
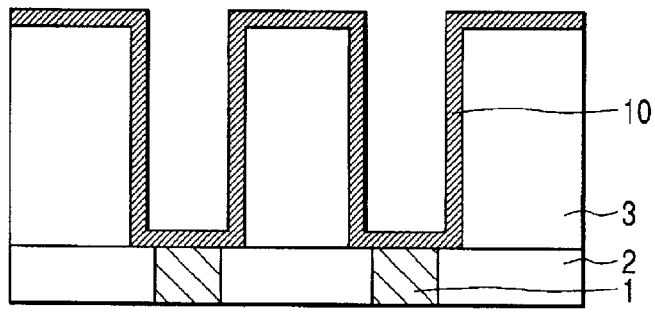
FIG. 11 is a sectional view showing a semiconductor device produced by the conventional process.
Figure 11B:
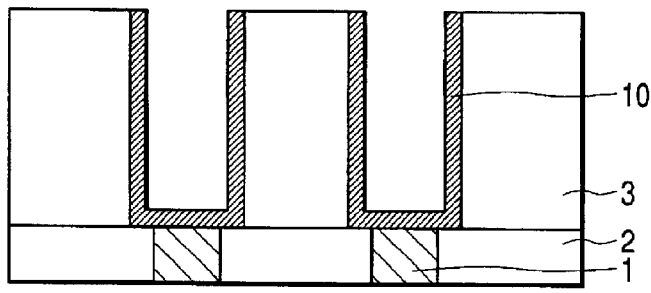
Figure 11C:
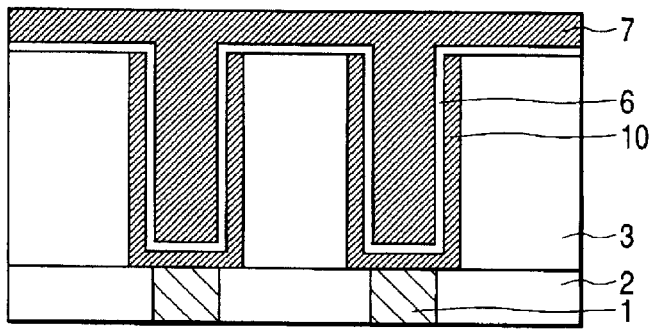

This example demonstrates, with reference to FIG. 10, a method for making a capacitor storage element using the process for forming the concave lower ruthenium electrode and the upper ruthenium electrode by chemical vapor deposition as explained in Example 3.

The first step begins with the formation on a substrate 11 of Si an element isolator 12 by thermal oxidation and a diffusion layer 13 by ion implantation. On these structures are formed word lines 14 and 15 in laminate form consisting of poly-Si and $WSi_2$. Bit lines 18 and 19 in laminate form consisting of poly-Si and $WSi_2$ are formed on a barrier layer 17 of $Si_3N_4$. A first plug 16 of poly-Si, a second plug 20, and a barrier 21 of TiN are formed on the plug insulating interlayer 22 of $SiO_2$ and the insulating interlayer 23 of $Si_3N_4$. This laminated plug electrically connects the diffusion layer 13 of the transistor to the lower electrode 26 of the capacitor.

In other words, the process explained in Example 3 is used to form the capacitor insulating interlayer 24 of $SiO_2$, the lower Ru seed layer 25 by sputtering, the lower Ru electrode 26 by chemical vapor deposition, and the capacitor insulating film 27 of $Ra_2O_5$. Then, the process explained in Example 3 is used to form the upper Ru seed layer 28 and the upper Ru electrode 29 by chemical vapor deposition. The wiring insulating interlayer 30 of $SiO_2$ and the second wiring layer 31 of W are then formed on the capacitor. The resulting capacitor storage element has the desired memory action.

The steps employed to make the capacitor storage element are not limited to those mentioned above. For example, the convex lower ruthenium electrode and the upper ruthenium electrode may be formed by the chemical vapor deposition explained in Example 4. Also, the convex lower ruthenium electrode may be formed by the sputtering method explained in Example 5 and the upper ruthenium electrode may be formed by chemical vapor deposition. The capacitor storage element obtained in this manner has the desired memory action.

SEVENTH EXEMPLARY EMBODIMENT (EXAMPLE 7)

This example demonstrates a process for forming, by chemical vapor deposition, a ruthenium film on a substrate surface having concave parts. This process is carried out in the presence of an organoruthenium compound precursor, an oxidizing gas, and an inert gas which is hardly adsorbed to the Ru surface, such that the partial pressure of oxygen in the film-forming chamber is reduced and the amount of oxygen adsorbed to the surface is reduced. The ruthenium film formed in this manner preferably has good conformality.

In this example, the organoruthenium compound is $Ru(C_5H_4C_2H_5)_2$ or $Ru(EtCp)_2$ and the oxidizing gas is oxygen ($O_2$). The apparatus shown in FIG. 12 may used to form the ruthenium film. The CVD unit comprises of a preparatory chamber, a film forming chamber, and a gas supply system. The gas supply system consists of a supply system for CVD raw materials and a supply system for oxidizing gas and other gases. The raw material is supplied by liquid bubbling. The vaporized raw material is transferred to the mixer by a carrier gas (e.g., argon) which is passed through $Ru(EtCp)_2$ liquid held in the constant temperature bath at 60° C. Oxygen and argon are supplied through separate routes.

The $Ru(ErCp)_2$ gas, carrier gas (argon), and oxygen and argon supplied through separate routes are mixed in the mixer and the mixture gas is supplied to the substrate through the distributor. The gas supply system from the evaporator to the film-forming chamber and the outer wall of the film-forming chamber are kept at 150–180° C. to prevent the raw material from liquefaction and decomposition. Argon is also supplied from the side wall of the chamber and the lower part of the wafer so as to prevent the deposition of Ru film on the heater.

Prior to film forming, a Ru seed layer (20 nm thick) is formed by sputtering according to the process shown in Example 1. The seed layer reduces the incubation period required for nucleation. The supply of carrier gas (argon) is fixed at 150 sccm. The supply of oxygen, the supply of argon (other than carrier gas), and the pressure in the film-forming chamber are adequately controlled so that oxygen and argon give their partial pressures as desired.

Figure 13:
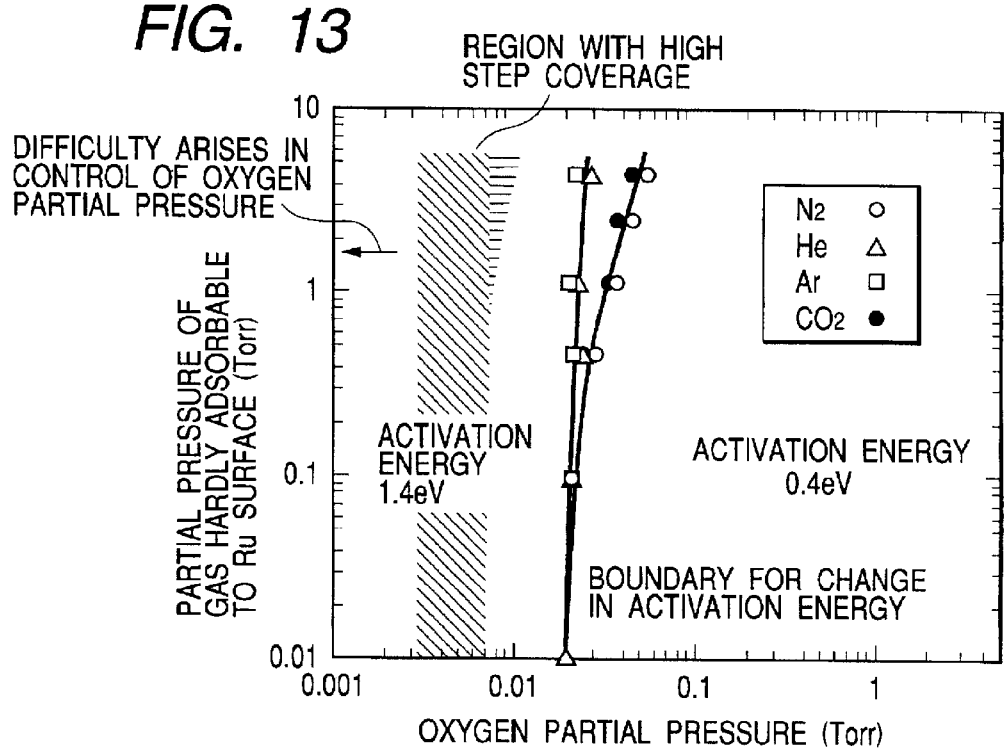
FIG. 13 shows how the activation energy for decomposition of $Ru(C_5H_4C_2H_5)_2$ varies depending on the partial pressure of oxygen and the partial pressure of the gas which is hardly adsorbed to the Ru surface.

FIG. 13 shows how the activation energy for decomposition reaction of $Ru(EtCp)_2$ varies with the partial pressure of $O_2$ and the partial pressure of Ar. The obliquely hatched area in FIG. 13 denotes the region for high step coverage (with an aspect ratio of 15). It is noted that in order to form a Ru film with good conformality in a deep hole with an aspect ratio of 15, it is necessary to keep the partial pressure of oxygen below 0.007 Torr irrespective of the partial pressure of argon. This also holds true in the case where argon is replaced by any other rare gas such as Ne, He, and Xe. In the case of nitrogen ($N_2$) or carbon dioxide ($CO_2$), as shown in FIG. 13, as their partial pressure increases, the partial pressure of oxygen for a change in activation energy moves to the higher side. In this case, the region with high step coverage shifts toward the side in which the partial pressure of oxygen is high. The partial pressure is lower than 0.01 Torr in this region as well as the horizontally hatched region in FIG. 13.

In the procedure explained above, the CVD raw material is $Ru(C_5H_4C_2H_5)_2$; however, this material may be replaced by any of $Ru(OD)_3$, $Ru(CH_3C_5H_4)_2$, $Ru(C_5H_5)_2$, and $Ru(C_{11}H_{19}O_2)_3$ to produce the same effect. (The latter three are solid at room temperature.) The gases to be introduced to reduce the partial pressure of oxygen include Ar, Ne, He, Xe, $N_2$, $CO_2$, etc., which are hardly adsorbed to Ru. Nonpolar hydrocarbon compounds without multiple bonds produce the same effect. The condition for high conformality irrespective of the gas which is hardly adsorbed to Ru is indicated by the regions with oblique and horizontal hatching in FIG. 13. In the procedure explained above, the oxygen is used to decompose the CVD raw material; however, oxygen may be replaced by such oxidizing gases as $N_2O$, $H_2O$, $NO_2$, and $O_3$, to produce the same effect. The optimal substrate temperature ranges from 200° C. to 400° C. regardless of the organoruthenium compound used and the oxidizing and other gases used. The seed layer may be formed from platinum group metal (such as Ru, Rh, Pd, Os, Ir, and Pt) or from Co, Fe, etc., and/or an alloy thereof.

EIGHTH EXEMPLARY EMBODIMENT
(EXAMPLE 8)

This example demonstrates a process for forming, by chemical vapor deposition, a ruthenium film on a substrate surface having concave parts. This process is carried out in the presence of an organoruthenium compound precursor, an oxidizing gas, and a gas which is readily adsorbed to the Ru surface, such that the amount of oxygen adsorbed to the surface is reduced. The ruthenium film formed in this manner has good conformality.

Figure 12:
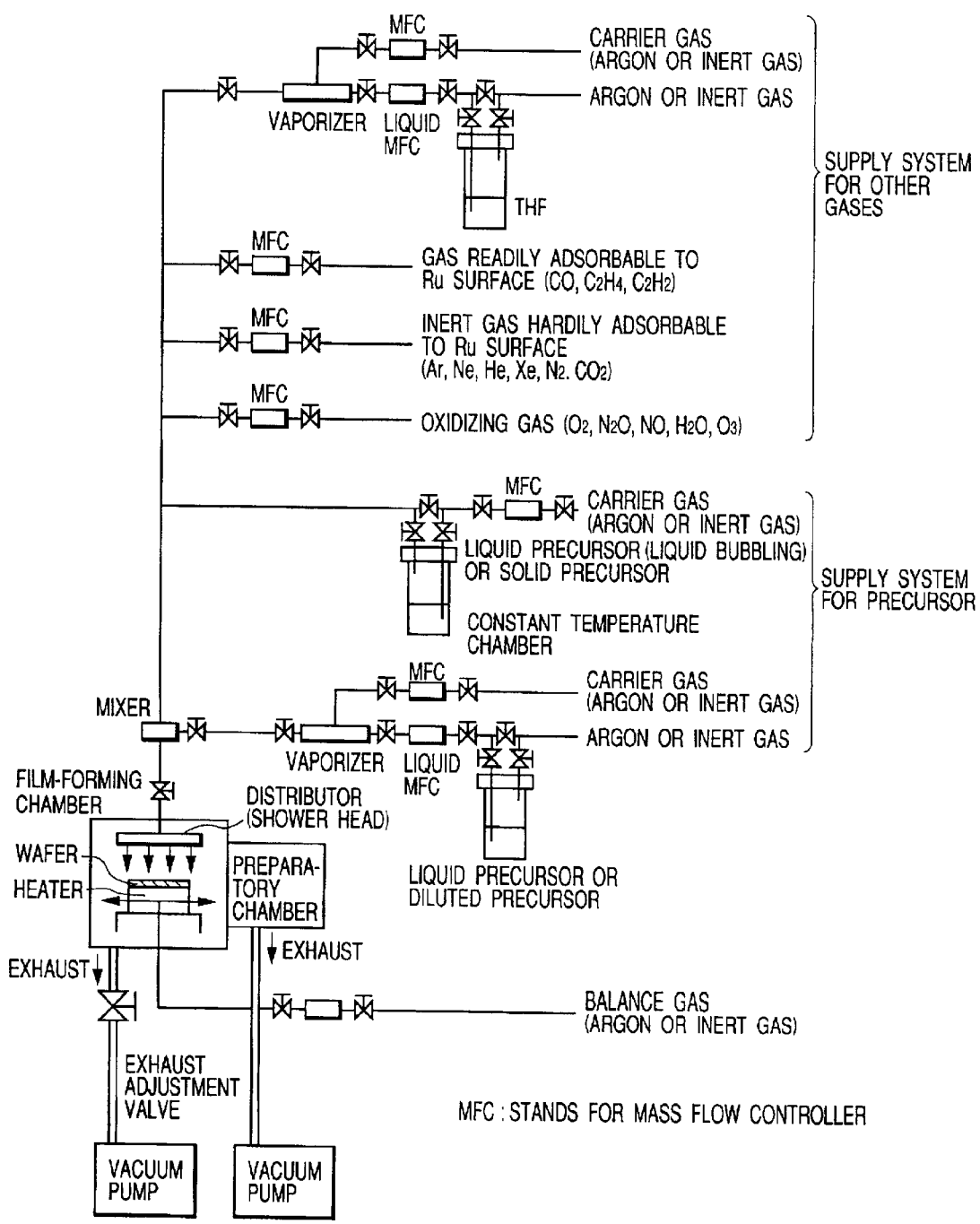
FIG. 12 shows the construction of an apparatus used in Examples 7 and 8.

In this example, the organoruthenium compound is $Ru(EtCp)_2$, the oxidizing gas is oxygen ($O_2$), and the gas which is readily adsorbed to the Ru surface is THF. The apparatus shown in FIG. 12 may be used to form the ruthenium film. The raw material is supplied by the liquid bubbling method with argon as a carrier gas, as explained in Example 7. In this example, the gas which is readily adsorbed to the Ru surface is supplied through a separate route. In the case of THF gas, the supply of THF liquid is controlled by the liquid mass flow meter as shown in FIG. 12, and the THF liquid is vaporized in the vaporizer kept at 150° C. The THF vapor is supplied to the mixer at a flow rate of 150 sccm by a carrier gas (argon). In the case where the gas which is readily adsorbed to the Ru surface is gas at room temperature, the vaporizer is not required.

The $Ru(ErCp)_2$ gas, carrier gas (argon), oxygen, argon, and THF vapor supplied through separate routes are mixed in the mixer, and the mixture gas is supplied to the substrate through the distributor. The gas supply system from the evaporator to the film-forming chamber and the outer wall of the film-forming chamber are preferably kept at 150–180° C. to prevent the raw material from liquefaction and decomposition. Argon is also supplied from the side wall of the chamber and the lower part of the wafer so as to prevent the deposition of Ru film on the heater.

Prior to film forming, a Ru seed layer is formed by sputtering according to the process described in Example 1. The seed layer reduces the incubation period required for nucleation. The supply of carrier gas (argon) is fixed at 150 sccm. The supply of oxygen, the supply of THF vapor, and the supply of argon (other than carrier gas) are adequately controlled so that oxygen and THF vapor give their partial pressures as desired. The amount of exhaust is controlled so that the pressure in the film-forming chamber is 5 Torr.

Figure 14:
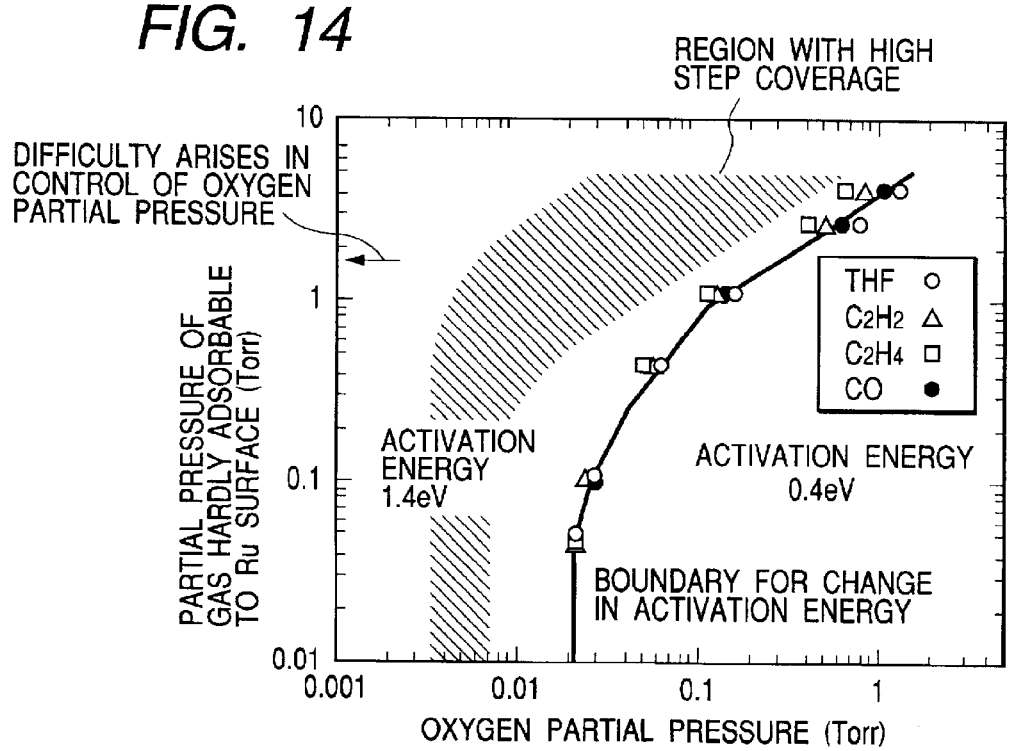
FIG. 14 shows how the activation energy for decomposition of $Ru(C_5H_4C_2H_5)_2$ varies depending on the partial pressure of oxygen and the partial pressure of the gas which is readily adsorbed to the Ru surface.

FIG. 14 shows how the activation energy for decomposition reaction of $Ru(EtCp)_2$ varies with the partial pressure of $O_2$ and the partial pressure of THF vapor. The obliquely hatched area in FIG. 14 denotes the region for high step coverage (with an aspect ratio of 15). It is possible to form Ru film with good conformality in a deep hole with an aspect ratio of 15, if the supply of THF liquid is 5 sccm, the supply of oxygen is 50 sccm, and the supply of argon (other than carrier gas) is 600 sccm. Under such conditions, the partial pressure of oxygen and THF vapor in the film-forming chamber is 0.11 Torr and 2.95 Torr, respectively.

There is also an alternative way of supplying THF vapor in which THF is used as a solvent (diluent) for $Ru(EtCp)_2$. In this way, it is possible to supply the THF vapor and the raw material simultaneously. The solution of $Ru(EtCp)_2$ (0.1 ml/L) in THF liquid is supplied at a flow rate of 5 sccm controlled by the liquid mass flow meter. The solution is vaporized in a vaporizer kept at 150° C. The resulting vapor is supplied to the mixer together with a carrier gas (argon) at a flow rate of 150 sccm. In this way, it is possible to achieve high conformality.

The argon supplied as mentioned above may be replaced by any other rare gas such as Ne, He, and Xe, or nitrogen ($N_2$) or carbon dioxide ($CO_2$). The same result as mentioned above is also obtained if THF is replaced by carbon monoxide (CO), ethylene ($C_2H_4$), or acetylene ($C_2H_2$). As shown in FIG. 14, it is possible to reduce the density of oxygen adsorbed to the Ru surface by increasing its partial pressure.

In the procedure explained above, the CVD raw material is $RU(C_5H_4C_2H_5)_2$; however, this material may be replaced by any of $Ru(OD)_3$, $Ru(CH_3C_5H_4)_2$, $RU(C_5H_5)_2$, and $Ru(C_{11}H_{19}O_2)_3$ to produce the same effect. (The latter three are solid at room temperature.) The gases to be introduced to reduce the partial pressure of oxygen include THF, CO, $C_2H_4$, and $C_2H_2$ with polar molecular structure or multiple bond structure which are readily adsorbed to Ru. They can be used in vapor form if they have a boiling point lower than 150° C. even though they are liquid at normal temperature. The condition for high conformality (for an aspect ratio of 15) is indicated by the regions with oblique hatching in FIG. 14. In this region, the partial pressure of oxygen is lower than 0.5 Torr. Since the above-mentioned organoruthenium compound such as $Ru(C_5H_4C_2H_5)_2$ is readily absorbable to the Ru surface, it is possible to reduce the amount of oxygen adsorbed and to increase step coverage by increasing its supply. For increased step coverage, the supply of organoruthenium compound (in terms of gas) should be more than one-fifth of the supply of oxygen. This increases the amount of Ru raw material to be consumed, which leads to a high production cost.

In the procedure explained above, the oxygen is used to decompose the CVD raw material; however, oxygen may be replaced by such oxidizing gases as $N_2O$, $H_2O$, $NO_2$, and $O_3$ to produce the same effect. The optimal substrate temperature ranges from 200° C. to 400° C. regardless of the organoruthenium compound and the oxidizing and other gases used. The seed layer may be formed from platinum group metal (such as Ru, Rh, Pd, Os, Ir, and Pt) or from Co, Fe, etc., and/or alloy thereof. The above processes may be used to form a high dielectric constant capacitor according to Examples 3, 4, and 5.

According to the present invention, it is possible to form, by chemical vapor deposition, a ruthenium film having both good productivity and good conformality. Thus the present invention contributes to high integration (storage space per chip area) through miniaturization of semiconductor capacitive elements, improvement in yields through the simplification of steps, and cost reduction through reduction in the number of process steps.

Nothing in the above description is meant to limit the present invention to any specific materials, geometry, or orientation of parts. Many part/orientation substitutions are contemplated within the scope of the present invention. The embodiments described herein were presented by way of example only and should not be used to limit the scope of the invention.

Although the invention has been described in terms of particular embodiments in an application, one of ordinary skill in the art, in light of the teachings herein, can generate additional embodiments and modifications without departing from the spirit of, or exceeding the scope of, the claimed invention. Accordingly, it is understood that the drawings and the descriptions herein are proffered by way of example only to facilitate comprehension of the invention and should not be construed to limit the scope thereof.

What is claimed is:

1. A process for producing a semiconductor device, comprising the step of:

forming a ruthenium film on the surface of a substrate which has concave parts, said forming step utilizing chemical vapor deposition from an organoruthenium compound as a precursor in the presence of an oxidizing gas and a gas which has a higher tendency to be adsorbed to a surface of the ruthenium film than the oxidizing gas and which at least partially interrupts the oxidizing gas from reacting with the organoruthenium compound, wherein a partial pressure of said oxidizing gas is smaller than a partial pressure of gas which has a higher tendency to be adsorbed to a surface of the ruthenium film.

2. A process for producing a semiconductor device as defined in claim 1, wherein said chemical vapor deposition is conducted under a condition in which the density of the oxidizing gas adsorbed to the surface of the ruthenium film is lower than if the chemical vapor deposition was carried out in the absence of said gas which has a higher tendency to be adsorbed to the surface of the ruthenium film.

3. A process for producing a semiconductor device as defined in claim 2, wherein the gas which has a higher tendency to be adsorbed to a surface of the ruthenium film is the organoruthenium compound as a raw material.

4. A process for producing a semiconductor device as defined in claim 1, wherein the oxidizing gas is selected from the group consisting of $O_2$, $N_2O$, NO, $O_3$, and $H_2O$.

5. A process for producing a semiconductor device as defined in claim 4, wherein the organoruthenium compound is at least one compound selected from the group consisting of bis(cyclopentadienyl)ruthenium, bis(methylcyclopentadienyl)ruthenium, bis(ethylcyclopentadienyl)ruthenium, and tris(dipivaloylmethanate)ruthenium.

6. A process for producing a semiconductor device as defined in claim 1, wherein the gas which has a higher tendency to be adsorbed to a surface of the ruthenium film is supplied such that the density of the oxidizing gas adsorbed to the surface of the ruthenium film decreases when the supply of said gas which is readily adsorbed to a surface of the ruthenium film is increased and the supply of the oxidizing gas is kept constant.

7. A process for producing a semiconductor device as defined in claim 1, wherein the gas which has a higher tendency to be adsorbed to a surface of the ruthenium film is at least one gas selected from the group consisting of tetrahydrofuran, CO, $C_2H_4$, and $C_2H_2$.

8. A process for producing a semiconductor device as defined in claim 1, wherein the oxidizing gas has a partial pressure lower than 0.5 Torr in a film-forming chamber in which the chemical vapor deposition takes place.

9. A process for producing a semiconductor device as defined in claim 1, further comprising the step of:

before said chemical vapor deposition forming step, forming a seed layer from at least one material selected from the group consisting of ruthenium, platinum, iridium, rhodium, osmium, palladium, cobalt, iron, and an alloy thereof.

10. A process for producing a semiconductor device as defined in claim 1, wherein the organoruthenium compound is at least one compound selected from the group consisting of bis(cyclopentadienyl)ruthenium, bis(methylcyclopentadienyl)ruthenium, bis(ethylcyclopentadienyl)ruthenium, and tris(dipivaloylmethanate)ruthenium.

11. A process for producing a semiconductor device, said process comprising the steps of:

providing a substrate;

depositing, via chemical vapor deposition, a ruthenium film on said substrate from an organoruthenium compound as a precursor in the presence of an oxidizing gas and a gas which has a higher tendency to be adsorbed to a surface of the ruthenium film than the oxidizing gas and which at least partially interrupts the ability of the oxidizing gas to react with the precursor, wherein a partial pressure of said oxidizing gas is smaller than a partial pressure of said gas which has a higher tendency to be adsorbed to a surface of the ruthenium film.

* * * * *